US008507327B2

(12) United States Patent
Tsukamoto et al.

(10) Patent No.: US 8,507,327 B2
(45) Date of Patent: Aug. 13, 2013

(54) SEMICONDUCTOR DEVICE MANUFACTURING METHOD THEREOF

(75) Inventors: Yasuhiko Tsukamoto, Shiojiri (JP); Kazuo Shimoyama, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 216 days.

(21) Appl. No.: 12/989,226

(22) PCT Filed: May 13, 2009

(86) PCT No.: PCT/JP2009/058927
§ 371 (c)(1),
(2), (4) Date: Jan. 14, 2011

(87) PCT Pub. No.: WO2009/139417
PCT Pub. Date: Nov. 19, 2009

(65) Prior Publication Data
US 2011/0108883 A1 May 12, 2011

(30) Foreign Application Priority Data

May 13, 2008 (JP) ................................. 2008-125402

(51) Int. Cl.
*H01L 21/332* (2006.01)
(52) U.S. Cl.
USPC .................... 438/135; 438/462; 257/E21.347; 257/E21.382
(58) Field of Classification Search
USPC ......... 438/135, 234, 414, 462, 524; 257/273, 257/E21.347, E21.382
See application file for complete search history.

(56) References Cited

U.S. PATENT DOCUMENTS

| 5,164,218 A | 11/1992 | Tsuruta et al. |
| 5,313,092 A | 5/1994 | Tsuruta et al. |
| 5,688,702 A * | 11/1997 | Nakagawa et al. ........... 438/234 |
| 2006/0038206 A1 | 2/2006 | Shimoyama et al. |
| 2006/0249797 A1 | 11/2006 | Nakazawa et al. |
| 2007/0166957 A1 | 7/2007 | Kameyama et al. |

FOREIGN PATENT DOCUMENTS

| JP | 02-298073 A | 12/1990 |
| JP | 06-089936 A | 3/1994 |
| JP | 09-213965 A | 8/1997 |
| JP | 2001-185727 A | 7/2001 |

(Continued)

OTHER PUBLICATIONS

International Search Report issued in related PCT/JP2009/058927 mailed Jul. 14, 2009.

(Continued)

*Primary Examiner* — David Vu
(74) *Attorney, Agent, or Firm* — Rossi, Kims & McDowell LLP

(57) ABSTRACT

Cutting work is performed on an n-semiconductor substrate (1) with an inverted trapezoid-shaped dicing blade to form grooves to be a second side walls (7). Bottom portions of the grooves are contacted with a p-diffusion layer (4) which is formed on a first principal plane (2) (front face) of the n-semiconductor substrate (1), so that the p-diffusion layer (4) is not cut. Then in the second side walls (7), a p-isolation layer (9) connected to a p-collector layer (8) and the p-diffusion layer (4) is formed. Since the p-diffusion layer (4) is not cut, a glass support substrate for supporting a wafer, and expensive adhesive, are not required, and therefore the p-isolation layer (4) can be formed at low cost.

17 Claims, 15 Drawing Sheets

(56) References Cited

FOREIGN PATENT DOCUMENTS

| | | |
|---|---|---|
| JP | 2003-124151 A | 4/2003 |
| JP | 2004-336008 A | 11/2004 |
| JP | 2004-363328 A | 12/2004 |
| JP | 2004-363517 A | 12/2004 |
| JP | 2006-156926 A | 6/2006 |
| JP | 2006-222359 A | 8/2006 |
| JP | 2006-278382 A | 10/2006 |
| JP | 2006-303410 A | 11/2006 |
| JP | 2007-096078 A | 4/2007 |
| JP | 2007-273941 A | 10/2007 |

OTHER PUBLICATIONS

Shimoyama, Kazuo et al., "A New Isolation Technique for High Breakdown Voltage Reverse Blocking IGBT", "[Electronic Device/Semiconductor Power Conversion], General Power Device and Semiconductor Power Conversion", Technical Society of the Institute of Electrical Engineers of Japan, EDD-06-52, SPC-06-124 . Partial English translation provided.

Guizhen, Yan et al., "An improved TMAH Si-etching solution without attacking exposed aluminum", Sensors and Actuators, 2001, pp. 135-141, A89, Elsevier Science B.V., China.

Office Action issued in corresponding Chinese patent application No. CN200980116546.0, dated Mar. 26, 2012. Partial English translation provided.

Japanese Office Action cited in Japanese counterpart JP2010-512002, dated Apr. 2, 2013. Partial English translation provided. References cited in JPOA have already been considered by the Examiner.

* cited by examiner

SEMICONDUCTOR DEVICE MANUFACTURING METHOD THEREOF

This application is a U.S. National Phase Application of PCT International Application PCT/JP2009/058927 filed on May 13, 2009 which is based on and claims priority from JP 2008-125402 filed on May 13, 2008 the contents of which are incorporated herein by reference in their entirety.

TECHNICAL FIELD

The present invention relates to a semiconductor device, such as a reverse blocking IGBT (Insulated Gate Bipolar Transistor) used for a power conversion device or the like, and a manufacturing method thereof.

BACKGROUND ART

A conventional method for manufacturing a reverse blocking IGBT will be described. A first prior art is a method of coating a dopant source and performing thermal diffusion from the surface of the dicing region on a wafer (silicon) in advance, before forming the gate/emitter structure constituting the reverse blocking IGBT, as shown in FIG. 26, where a deep p-isolation layer is formed, the wafer is thinned so that the p-isolation layer is exposed after the gate/emitter structure is formed, and a p-collector layer, to be connected to the p-isolation layer, is formed by performing ion implantation and annealing on the rear face of the thinned wafer (e.g. see Patent Document 1 listed below).

According to a second prior art, shown in FIG. 27, an MOS structure is formed in the IGBT front surface process, the rear face of the wafer is lapped, and the MOS structure side is bonded with a glass substrate. Then the front face and the back face are flipped over, a mask pattern is formed on the rear face which is now positioned on top, and V grooves are formed by anisotropic wet etching using an alkaline solution, for example. A p-diffusion layer is formed on the front face of the wafer near the dicing region, so as to form the gate/emitter structure (MOS structure). Then the mask is removed, and Boron ion implantation and laser annealing are simultaneously performed on the side walls of the V grooves and rear face of the wafer, to form the p-isolation layer and p-collector layer, a metal electrode film (e.g. Au layer) to be the collector electrode, is formed thereon, and the reverse blocking IGBT is formed by pickup (e.g. see Patent Document 2, Patent Document 3 and Non-patent Document 1 listed below). FIG. 28 is a cross-sectional view of a key section of the outer periphery area of the reverse blocking IGBT formed by the second prior art. The p-diffusion layer on the front face side of the wafer and the p-collector layer on the rear face side of the wafer are connected by the p-isolation layer formed on the side walls of the V grooves.

As laser oscillators decrease in size and price and increase in life and performance, laser irradiation processing is becoming more widely used for silicon wafers. One example is the above mentioned laser annealing processing for activating dopants implanted by ion implantation. Another available method for activating dopants implanted by ion implantation is a furnace annealing processing, but in this case, the processing temperature is limited by the heat resistance temperature of the metal electrode film and protective film already formed on the front face of the wafer, therefore processing at high temperature is not possible, and the dopant activation ratio is low. The case of laser annealing processing using a pulse laser can instantaneously and locally heat only the surface layer region on the rear face of the wafer, so thermal damage is not caused to the metal electrode film and protective film already formed on the front face side of the wafer. Therefore the dopants on the rear face side can be activated at a high activation ratio, regardless the heat resistance temperature of the structure on the front face side of the wafer.

Patent Document 1: Japanese Patent Application Laid-Open No. 2004-363328
Patent Document 2: Japanese Patent Application Laid-Open No. 2006-303410
Patent Document 3: Japanese Patent Application Laid-Open No. 2006-278382
Non-patent Document 1: Kazuo Shimoyama, and two others: "New Isolation Technique for High Breakdown Voltage Reverse Blocking IGBT", "[Electronic Device/Semiconductor Power Conversion], General Power Device and Semiconductor Power Conversion", Technical Society of the Institute of Electrical Engineers of Japan, EDD-06-52, SPC-06-124

In the case of forming the p-isolation layer from the front face of the semiconductor substrate to the collector layer surface of the rear face thereof only by thermal diffusion according to the first prior art, a very thick thermal oxide film must be formed so that the Boron forming the p-isolation layer does not penetrate through the oxide film masking the active portion. In order to form this thick thermal oxide film, thermal oxidation processing must be performed at high temperature for a long time, which increases the manufacturing cost.

The diffusion of dopants requires a lengthy processing time at high temperature, so throughput dramatically drops, and the dopants are inevitably diffused in the lateral direction since the dopants isotropically diffuse from the mask opening portion to the silicon bulk, which causes problems in reducing device pitch and chip size.

An available method for preventing this is the second prior art, where the thinning processing of the wafer is performed after forming the device structure on the front face, such as the gate/emitter structure, as mentioned above, and after the wafer is bonded with the glass support substrate so as to face the front face of the device, the tapered V grooves are pierced through from the rear face of the wafer to the front face of the wafer by wet etching, and the p-isolation layer is formed on the side wall faces of the grooves by ion implantation and laser annealing. Here "tapered groove" refers to a groove having an inclined side wall at an angle where the groove width spreads from the bottom portion to the opening.

The heat treatment time and device pitch are dramatically decreased by this method, but piercing all the way to the front face of the wafer causes separation and individual chips to fall, so the wafer must be bonded with the glass substrate or the like, which makes processing complicated and increases manufacturing cost. After forming the pierced V grooves (penetrated grooves), ion implantation and laser annealing are performed, but as FIG. 29 shows, adhesive, which bonds the wafer and the glass substrate, is irradiated by the laser beam in portion A, that is a portion where the penetrated grooves (based portion of the V grooves), so a special expensive adhesive, which is not affected by irradiation of the laser beam, must be used, and therefore manufacturing cost increases.

Then the collector electrode is formed by sputtering after laser annealing, but a heat resistant expensive adhesive must be used so as not to be affected even if the adhesive is heated by this sputtering processing, which increases manufacturing cost. Or an expensive sputtering device having a special cooling mechanism must be used so that the heat temperature does not rise.

Another problem is that the sintering processing temperature, after sputtering, is limited by the heat resistance temperature of the adhesive. Furthermore, a special adhesive must be selected and the expensive adhesive must be used so that the volatile constituents from the adhesive do not drop the degree of vacuum of the sputtering device. In other words, the manufacturing cost increases if the conventional method is used.

Now a carrier profile depending on the tilt angle of the side wall of the V groove is checked. FIG. 30 is a graph depicting the carrier profile depending on the tilt angle of the side wall of the groove. In FIG. 30, the ordinate indicates the carrier concentration, and the abscissa indicates the depth. Here the tilt angle of the side wall of the V groove refers to an angle formed by a line on the opening portion of the groove, extending from the plane of the rear face of the wafer, where this opening portion is formed and the side wall of the groove. FIG. 30 shows a profile of the activated carriers on the side wall when laser annealing is performed by irradiating the pulse laser of which wavelength is 527 nm onto the plane where the opening of the V groove is formed from the vertical direction, with a 1.4 J/cm$^2$ irradiation energy density. In this case, it is assumed that dopants have already been implanted by Boron ion implantation. FIG. 30 shows carrier profiles when the tilt angles of the side wall of the V groove are 0° and 55° to 85° (at every 5°), which were cited from the above mentioned Non-patent Document 1.

When V grooves are formed on the rear face of the wafer by anisotropic wet etching using an alkaline solution, V grooves are formed to be the {111} plane since the rear face of the wafer is the {100} plane. Therefore the tilt angle of the side wall of the V groove is relatively small, 54.7°, and tapering is wide. Because of this, the difference between the width of the bottom portion of the groove and the width of the opening portion increases, and the side wall of the groove can absorb more laser beams irradiated vertically onto the rear face side of the wafer. Therefore if laser annealing is performed under the conditions of forming a high concentration p-collector layer on the plane (tilt angle" 0°) of the rear face of the wafer, as shown in FIG. 30, dopants implanted in the side wall of the V groove can be activated at the same time.

However if the tilt angle of the side wall of the V groove is greater than 60°, the activation ratio of the dopants decreases as the tilt angle increases, as shown in FIG. 30. This is because if the tilt angle of the V groove is θ, the effective irradiation energy density on the side wall of the V groove drops to a value multiplied by cos θ.

A known method for forming the V grooves, other than anisotropic wet etching using an alkaline solution, is an anisotropic dry etching called RIE (Reactive Ion Etching) using HBr, NF3 or He/O$_2$ as the etching gas. If grooves are formed by RIE etching, it is known that the tilt angle of the side wall of the groove becomes 90° or an angle close to this, but a groove of which tilt angle of the side wall is smaller than 90°, that is a tapered groove, can be formed by relatively increasing the flow rate of He/O$_2$, for example. However more black silicon tends to be generated as the flow rate of He/O$_2$ increases. Another problem of RIE etching is that the tilt angle of the side wall of the groove can be decreased only down to about 75°.

Another known method for forming tempered grooves, is, for example, a method of performing half cut dicing using a dicing blade of which edge is tapered.

RIE etching and half cut dicing are appropriate for forming an isolation layer using tapered grooves in the outer periphery portion of the reverse blocking IGBT chip having a trench gate structure, since tapered grooves can be formed regardless the plane orientation and crystal orientation of the wafer.

FIG. 31 and FIG. 32 are diagrams depicting the problems of performing laser annealing on a tapered groove. FIG. 31 and FIG. 32 show a case of performing laser annealing by irradiating laser onto a tapered groove vertical to a plane where an opening portion of the tapered grove is formed. In FIG. 31 and FIG. 32, the tilt angle of the side wall of the groove is assumed to be 75°.

As FIG. 31 shows, if the irradiation energy density of the laser beam 64, that is irradiated onto the plane, is 100%, then the effective irradiation energy density of the laser beam 64, irradiated onto the side wall of the tapered groove, is 100×cos 75°=25.9%, that is, a drop to about ¼ of that in the case of the plane. This means that with the irradiation energy density conforming to the conditions appropriate for the plane, dopants implanted into the side wall of the tapered groove cannot be activated.

In concrete terms, in order to form the p-collector layer on a plane, of which tilt angle is 0°, on the rear face side of the wafer by activating Boron implanted by ion implantation, the laser beam 64, of which irradiation energy density is 1.4 J/cm$^2$, for example, is irradiated. If the tilt angle of the side wall of the tapered groove is 75° in this case, the effective irradiation energy density of the laser beam 64 irradiated onto the side wall dramatically drops to cos 75°×1.4 J/cm$^2$=0.36 J/cm$^2$, with which dopants implanted in the side wall are not sufficiently activated.

On the other hand, as shown in FIG. 32, in order to activate the dopants implanted in the side wall of the tapered groove, the irradiation energy density of the laser beam 65 must be increased to four times thereof, but in this case, the irradiation energy density of the laser beam 65, that is irradiated onto the plane, also becomes four times thereof, and abrasion and crystal defects may be generated, or [crystals] may change into an amorphous state.

In concrete terms, if the tilt angle of the side wall of the tapered groove is 75°, irradiation energy density of the laser beam 65 must be 1/cos 75°×1.4 J/cm$^2$=5.4 J/cm$^2$ in order to obtain the 1.4 J/cm$^2$ effective energy density to be irradiated onto the side wall. With this however, a laser beam with excessive irradiation energy density is irradiated onto the plane, so abrasion and crystal defects may be generated on the plane, or [crystals] may change into an amorphous state.

DISCLOSURE OF THE INVENTION

In order to solve the above mentioned problems of the prior art, it is an object of the present invention to provide such a semiconductor device as a reverse blocking IGBT, which can form the p-isolation layer at low cost without requiring a glass support substrate and adhesive, and a manufacturing method thereof. It is another object of the present invention to provide a method for manufacturing such a semiconductor device as a reverse blocking IGBT, which can sufficiently activate dopants implanted in the side walls of tapered grooves, of which tilt angle is 60° or more, on the wafer using a simple method without allowing the laser beam to damage the plane where opening portions of the grooves are formed.

To solve the above mentioned problems and achieve the objects, a semiconductor device according to Claim 1 of the invention is a semiconductor device including: a first conductive type semiconductor substrate; a second conductive type first region which is formed in an outer periphery portion on a surface of a first principal plane of the semiconductor substrate; a second conductive type well region which is enclosed by the first region and is formed on a surface layer of the first principal plane of the semiconductor substrate so as to be isolated from the first region; a first conductive type emitter region which is formed on a surface layer of the well region; a gate electrode which is formed, via a gate insulating film, on the well region sandwiched between the emitter region and the semiconductor substrate; an interlayer insulating film of which surface, including a surface on the gate electrode, is coated; an emitter electrode which is formed on the interlayer insulating film so as to contact the emitter region and the well region; a passivation film which is formed on the emitter electrode, the first region and the semiconductor substrate; a collector layer which is formed on a surface layer of a second principal plane of the semiconductor substrate; a second conductive type isolation layer which is formed on a surface layer of a side wall of the semiconductor substrate contacting the first principal plane and the second principal plane, so as to contact the first region and the collector layer; and a collector electrode formed on the collector layer, wherein the side wall of the semiconductor substrate is constituted by a first side wall which vertically contacts the first principal plane and contacts the first region, and a second side wall which is connected to the first side wall and the second principal plane, and forms a 90° or more angle with the first side wall.

A semiconductor device according to Claim 2 of the invention is the invention according to Claim 1, characterized in that a surface of the first side wall is a cut surface which was cut by dicing or by laser, and a surface of the second side wall is a processed surface which is processed with a dicing blade.

A semiconductor device according to Claim 3 of the invention is the invention according to Claim 2, characterized in that cutting work is performed on the surface of the second side wall with a dicing blade to form a V groove, inverted trapezoid groove or U groove, and processing strain, formed by the cutting processing, is removed by etching.

A semiconductor device according to Claim 4 of the invention is the invention according to Claim 1, characterized in that the collector electrode extends onto the first side wall and the second side wall.

A semiconductor device according to Claim 5 of the invention is the invention according to Claim 1, characterized in that a distance between connecting lines of the first side wall contacting the first principal plane and the second side wall is 10 μm or more and 150 μm or less.

A method for manufacturing a semiconductor device according to Claim 6 of the invention includes the steps of: forming a second conductive type first region on a surface layer of a first principal plane of a wafer and in an outer periphery portion of a semiconductor device formed on the wafer; forming grooves which reach the first region with a dicing blade from a second principal plane to the first principal plane of the wafer; removing processing strain formed on the grooves by etching; forming a second conductive type isolation layer on a surface layer of the grooves and a second conductive type collector layer on a surface layer of the second principal plane so that the isolation layer and the collector layer are connected;
forming a collector electrode on the collector layer; and cutting into chips the wafer in the first region sandwiched between the first principal plane and each bottom portion of the grooves approximately vertically with respect to the first principal plane by dicing or by laser.

A method for manufacturing a semiconductor device according to Claim 7 of the invention is the invention according to Claim 6, characterized in that a depth of the first region is 30 μm or more and 170 μm or less.

A method for manufacturing a semiconductor device according to Claim 8 of the invention is the invention according to Claim 6 or Claim 7, characterized in that a distance between the bottom portions of the grooves and the first principal plane is 10 μm or more and 150 μm or less.

A method for manufacturing a semiconductor device according to Claim 9 of the invention is the invention according to Claim 6, characterized in that a shape of the dicing blade for forming the grooves is a V shape, inverted trapezoid shape or U shape.

A method for manufacturing a semiconductor device according to Claim 10 of the invention is the invention according to Claim 6 or Claim 8, characterized in that the collector electrode is extended toward an inner wall of the grooves.

A method for manufacturing a semiconductor device according to Claim 11 of the invention is the invention according to Claim 6 or Claim 8, characterized in that a depth of the processing strain of the grooves is 1 μm or more and 20 μm or less.

A method for manufacturing a semiconductor device according to Claim 12 of the invention is the invention according to Claim 6 or Claim 11, characterized in that a depth, when removing processing strain of the grooves by etching is 3 μm or more and 50 μm or less.

A method for manufacturing a semiconductor device according to Claim 13 of the invention is the invention according to Claim 6 or Claim 12, characterized in that the etching is performed by acid etching or dry etching.

A method for manufacturing a semiconductor device according to Claim 14 of the invention is the invention according to Claim 6, characterized in that a depth of the grooves in an outer periphery portion of the wafer, away from a region to be the chips is shallower than a depth of the grooves in the region to be the chips.

A method for manufacturing a semiconductor device according to Claim 15 of the invention is the invention according to Claim 6, characterized in that at least a part of the grooves do not reach an outer edge of the wafer in an outer periphery portion of the wafer away from a region to be the chips.

A method for manufacturing a semiconductor device according to Claim 16 of the invention is the invention according to Claim 6, characterized in that the isolation layer and the collector layer are simultaneously formed by performing ion implantation and thermal processing on side faces of the grooves formed with the dicing blade and the second principal plane.

A method for manufacturing a semiconductor device according to Claim 17 of the invention includes the steps of: forming a second conducive type first region on a surface layer of a first principal plane of a wafer and in an outer periphery portion of a semiconductor device formed on the wafer; forming a composite mask by forming an aluminum film and a negative resist film in this sequence on a second principal plane of the wafer and performing patterning; performing dry etching using the composite mask as an etching mask and forming grooves reaching the first region so that a groove width widens from a bottom portion to an opening portion; selectively removing the negative resist film; implanting second conductive type impurity ions into the second principal plane under the aluminum film and side faces of the grooves; irradiating a first laser beam onto an entire surface on a side of the second principal plane of the wafer under relatively high energy conditions, which are appropriate for activating the impurity ions implanted into the side faces of the grooves, in a state of the aluminum film remaining in the second principal plane of the wafer, and forming a second conductive type isolation layer on a surface layer of the side faces of the grooves; removing the aluminum film and exposing the second principal plane; irradiating a second laser beam onto the entire surface on a side of the second principal plane of the wafer under relatively low energy conditions, which are appropriate for activating the impurity ions implanted into the second principal plane, and forming a second conductive type collector layer on a surface layer of the second principal plane so that the isolation layer and the collector layer are connected; forming a collector electrode on the collector layer; and cutting into chips the wafer in the first region sandwiched between the first principal plane and each bottom portion of the grooves approximately vertically with respect to the first principal plane by dicing or by a laser beam.

A method for manufacturing a semiconductor device according to Claim 18 of the invention is the invention according to Claim 17, characterized in that the aluminum film is formed to have a thickness that is thicker than 0.05 μm and thinner than 1 μm.

A method for manufacturing a semiconductor device according to Claim 19 of the invention includes the steps of: forming a second conductive type first region on a surface layer of a first principal plane of a wafer and in an outer periphery portion of a semiconductor device formed on the wafer; forming an aluminum film on a second principal plane of the wafer; forming grooves reaching the first region from the second principal plane to the first principal plane of the wafer with a dicing blade so that a groove width widens from a bottom portion to an opening portion; implanting second conductive type impurity ions into the second principal plane under the aluminum film and side faces of the grooves; irradiating a first laser beam onto an entire surface on a side of the second principal plane of the wafer under relatively high energy conditions, which are appropriate for activating the impurity ions implanted into the side faces of the grooves, in a state of the aluminum film remaining in the second principal plane of the wafer, and forming a second conductive type isolation layer on a surface layer of the side faces of the grooves; removing the aluminum film and exposing the second principal plane; irradiating a second laser beam onto the entire surface on a side of the second principal plane of the wafer under relatively low energy conditions, which are appropriate for activating the impurity ions implanted into the second principal plane and forming a second conductive type collector layer on the surface layer of the second principal plane so that the isolation layer and the collector layer are connected; forming a collector electrode on the collector layer; and cutting into chips the wafer in the first region sandwiched between the first principal plane and each bottom portion of the grooves approximately vertically to the first principal plane by dicing or by a laser beam.

A method for manufacturing a semiconductor device according to Claim 20 of the invention is the invention according to Claim 19, further including a step of removing processing strain, formed in the grooves due to the dicing blade, by etching in a state of the aluminum film remaining, after the grooves are formed with the dicing blade and before implanting the impurity ions.

A method for manufacturing a semiconductor device according to Claim 21 of the invention is the invention according to Claim 19, characterized in that the cross-sectional shape of the dicing blade for forming the grooves is a V shape or an inverted trapezoid shape.

A method for manufacturing a semiconductor device according to Claim 22 of the invention is the invention according to any one of Claim 17 to Claim 21, characterized in that the groove is formed so that an angle, formed by a line extending from the second principal plane where the opening portion is formed and the side face of the groove, is 40° or more and 85° or less on the opening portion of the groove.

According to this invention, in such a semiconductor device as a reverse blocking IGBT, a p-diffusion layer is formed on a front face of the wafer near the dicing region of the wafer, and grooves are formed from the rear face of the wafer to the front face of the wafer, such that the grooves reach the p-diffusion layer but do not reach the front face of the wafer, with a part of the wafer thickness in the bottom portions of the grooves remaining as residual film, whereby the conventionally required glass support substrate is not required, and expensive adhesive for bonding the wafer to the glass support substrate is also not required. Since the glass support substrate and the adhesive are unnecessary, the grooves and p-isolation layer can be formed at low cost.

By making the depth of the grooves in the outer periphery portion of the wafer to be shallower, or by not forming grooves near the edge portion of the wafer, the mechanical strength of the wafer in the outer periphery portion can be strengthened so that the self-weight of the wafer can be supported by the wafer itself. This makes handling of the wafer easier. By setting the thickness of the residual film to 10 μm or more and strengthening the outer periphery portion of the wafer, the glass support substrate can be unnecessary. By setting the depth of the p-diffusion layer to 170 μm or less, the processing time for the thermal diffusion processing step, which is performed at a high temperature for a long time, can be dramatically reduced, and manufacturing cost and lead time can be decreased.

If a groove of which opening portion is wider than the bottom portion is formed, the opening portion of the groove is formed when laser annealing is performed using a laser beam under relatively high energy conditions, which are appropriate for activating the dopants implanted in the side wall of the groove, and an aluminum film is formed on the plane (rear face of the ware) where the laser beam is vertically irradiated. Therefore irradiation of the laser beam under relatively high energy conditions onto the rear face of the wafer can be prevented. Since the laser beam having excessive energy is not irradiated onto the rear face of the wafer like this, the generation of abrasion and crystal defects can be prevented, and crystals changing into an amorphous state can be prevented.

BRIEF DESCRIPTION OF THE DRAWINGS

FIG. 1(a) is a cross-sectional view of a key position near a p-isolation layer, and FIG. 1(b) is a cross-sectional view of a key portion of an active region;

FIG. 2(a) is a case of a V-shaped dicing blade, FIG. 2(b) is a case of an inverted trapezoid-shaped dicing blade, FIG. 2(c) is a case of a U-shaped dicing blade, FIG. 2(d) is a case of a V-shaped groove in the semiconductor substrate, FIG. 2(e) is a case of an inverted trapezoid-shaped groove in the semiconductor substrate, and FIG. 2(f) is a case of a U-shaped groove in the semiconductor substrate;

FIG. 3(a) is a plan view, FIG. 3(b) is a cross-sectional view of a key portion sectioned at the X1-X1 line in FIG. 3(a), and FIG. 3(c) is a cross-sectional view of a key portion sectioned at the X2-X2 line in FIG. 3(a);

FIG. 12(a) is a plan view of the wafer, FIG. 12(b) is a cross-sectional view of a key portion sectioned at the X1-X1 line in FIG. 12(a), FIG. 12(c) is a cross-sectional view of a key portion sectioned at the X2-X2 line in FIG. 12(a), and FIG. 12(d) is a cross-sectional view of a key portion sectioned at the Y-Y line in FIG. 12(a);

FIG. 13(a) is a plan view of a key portion of the wafer, and FIG. 13(b) is a cross-sectional view of a key portion sectioned at the Y-Y line in FIG. 13(a);

Figure 1:
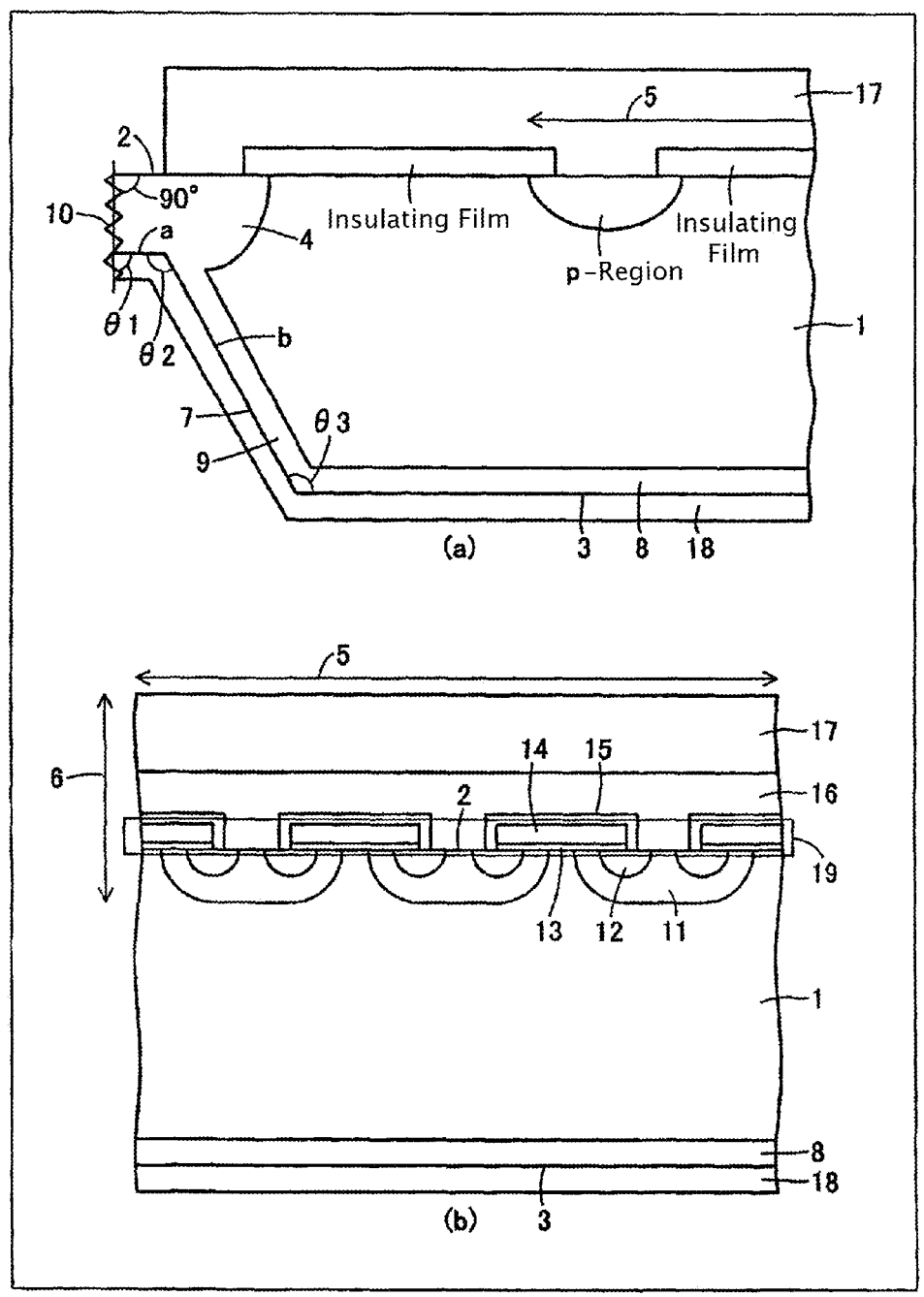
FIG. 1 are cross-sectional views of a semiconductor device according to Example 1 of the present invention, where

EXPLANATION OF REFERENCE NUMERALS 1 n-semiconductor substrate
2 first principal plane
3 second principal plane
4 p-diffusion layer
5 active region
6 device surface structure
7 second side wall
8 p-collector layer
9 p-isolation layer
10 first side wall
11 p-well region
12 n-emitter region
13 gate insulating film
14 gate electrode
15 interlayer insulating film
16 emitter electrode
17 passivation film
18 collector electrode
19 MOS gate structure
31 V-shaped dicing blade
32 inverted trapezoid-shaped dicing blade
33 U-shaped dicing blade
40 wafer
41 groove
42 chip forming region
43 residual film
44 outer periphery portion
45 outer edge
46 dicing region
47 damage layer
48 Boron
49 laser beam
50 dicing tape
51 dicing blade
61 Al film 62 negative resist film
63 first laser beam
64 second laser beam
71 alignment mark
72 dicing blade of which edge is tapered
73 etching gas (or etching solution)
200 rear face marking apparatus
201 stage
205 CCD camera
206 laser marking unit
210 opening portion

BEST MODE FOR CARRYING OUT THE INVENTION

Embodiments of a semiconductor device and a manufacturing method thereof according to the present invention will now be described with reference to the accompanying drawings.

EXAMPLE 1

FIG. 1 is a cross-sectional view of a semiconductor device according to Example 1 of the present invention, where FIG. 1(a) is a cross-sectional view of a key portion near a p-isolation layer, and FIG. 1(b) is a cross-sectional view of a key portion of an active region. For this semiconductor device, a reverse blocking IGBT is described as an example. This reverse blocking IGBT comprises: an n-semiconductor substrate 1; a p-diffusion layer 4 which is formed on an outer periphery portion of the surface of a first principal plane 2 of the n-semiconductor substrate 1; a device surface structure 6 which is formed on a surface layer of an active region 5 (region where main current flows) of a first principal plane 2 (front face) of the n-semiconductor substrate 1 so as to be enclosed by the p-diffusion layer 4, isolated from the p-diffusion layer 4; a p-collector layer 8 which is formed on the surface layer of a second principal plane 3; a collector electrode 18 which is formed on the p-collector layer 8, and a p-isolation layer 9 which is formed on the surface layer of a second side wall 7 of the semiconductor substrate 1 so as to contact the p-diffusion layer 4 and the p-collector layer 8.

The side wall of the semiconductor substrate 1 is comprised of a first side wall 10 which has been diced vertical to the first principal plane 2, and a second side wall 7 which contacts the first side wall 10 and the second principal plane 3. The second side wall 7 is comprised of a first area a, which is connected to the first side wall 10, and a second area b, which is connected to the first area a and the second principal plane 3 and on which the p-isolation layer 9 is formed.

The angle formed by the first principal plane 2 and the first side wall 10 is 90°, and the angle θ1 formed by the first side wall 10 and the first area a of the second side wall 7 is 90°. The angle θ2 formed by the first area a and the second area b of the second area 7 is more than 90°, and the angle θ3 formed by the second area b and the second principal plane 3 is the same as θ2, since the first principal plane 2 is in parallel with the first area a.

The first side wall 10 is a diced surface where bumps exist, so for an angle, a plane on which the bumps are averaged (vertical line in FIG. 1) is regarded as the surface of the first side wall 10. As FIG. 1 shows, θ1 and θ3 are angles measured on the side where the semiconductor substrate 1 exists, and θ2 is an angle measured on the side where the semiconductor substrate 1 does not exist. θ1 is an angle based on the first side wall 10, θ2 is an angle based on the first area a, and θ3 is an angle based on the second principal plane 3.

The depth of the p-diffusion layer 4 is 30 μm to 170 μm (preferably about 70 μm) in the case of a reverse blocking IGBT of which withstand voltage class is 1200 V, and the thickness of the first side wall 10 is smaller than the depth of the p-diffusion layer 4, since the p-diffusion layer 4 is exposed from the first side wall 10. In other words, the thickness of the first side wall 10 is 10 μm to 150 μm (preferably about 50 μm). The first side wall 10 is a side wall of a later mentioned residual film 43 after being cut by a dicing blade or laser beam, and the surface thereof of a diced surface or laser surface. The laser surface refers to a diced surface generated by laser dicing. The second side wall 7, on the other hand, is an inner wall of a layer mentioned groove 41, and is an etched surface.

As FIG. 1 shows, the device surface structure 6 formed on the active region 5 has a p-well region 11 which is formed on the surface layer of the n-semiconductor substrate 1, an n-emitter region 12 which is formed on the surface layer of the p-well region 11, and a gate electrode 14 which is formed on the p-well region 11 sandwiched between the n-emitter region 12 and the n-semiconductor substrate 1, via the gate insulating film 13.

Here the gate insulating film 13 and the gate electrode 14 are formed on a part of the n-emitter region 12, on the p-well region 11 and on the n-semiconductor substrate 1. The gate structure including both the gate insulating film 13 and the gate electrode 14 is hereafter called the "MOS gate structure 19" for convenience. In this example, the gate insulating film 13 is formed to be flat, as shown in FIG. 1(b), but a trench gate structure may be used, by forming grooves on the surface of the n-semiconductor substrate 1, and forming the gate insulating film 13 on the surface of the grooves.

[The device surface structure 6] also has an interlayer insulating film 15, which covers the gate electrode 14, an emitter electrode 16 which is formed on the interlayer insulating film 15 so as to contact the n-emitter region 12 and the p-well region 11, and a passivation film 17 which is formed on the entire surface area, including the areas on the emitter electrode 16 and the p-diffusion layer 4.

Figure 2:
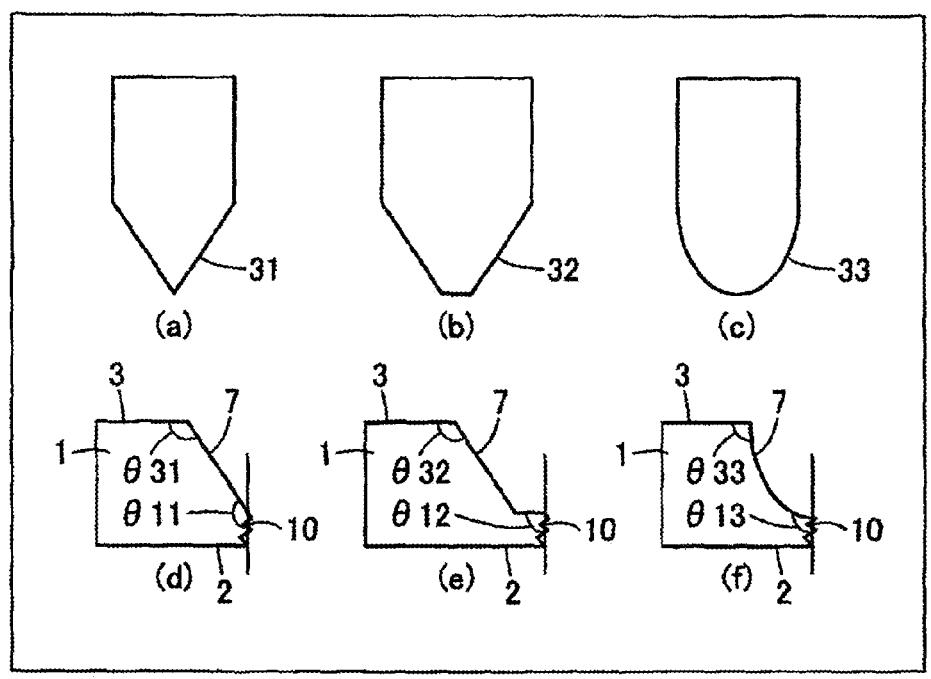
FIG. 2 are cross-sectional views of dicing blades having different shapes and a key portion of a semiconductor substrate processed thereby, where

FIG. 2 are cross-sectional views of dicing blades having different shapes and a key portion of the semiconductor substrate processed thereby, FIG. 2(a) to FIG. 2(c) are cross-sectional views of dicing blades, where FIG. 2(a) is a case of a V shape, FIG. 2(b) is a case of an inverted trapezoid shape and FIG. 2(c) is a case of a U shape, FIG. 2(d) to FIG. 2(f) are cross-sectional views of the semiconductor substrate, where FIG. 2(d) is a case of a V shape, FIG. 2(e) is a case of an inverted trapezoid shape, and FIG. 2(f) is a case of a U shape.

The cross-sectional shapes of the dicing blades 31, 32 and 33 have a V shape, inverted trapezoid shape and U shape respectively. The cross-sectional view of the semiconductor substrate 1 in FIG. 2(d) to FIG. 2(f) are the first principal plane 2 at the bottom, and the second principal plane 3 at the top, that is, the top and bottom are inverted for convenience.

In FIG. 2(d), the second side wall 7 is a straight line, and the angle θ11 formed by the first side wall 10 and the second side wall 7 is more than 90° (preferably about 140° to 160°). The angle θ31 formed by the second principal plane 2 and the second side wall 7 is more than 90° (preferably about 110° to 130°).

In FIG. 2(e), the second side wall 7 is a polygonal line, and the angle θ12 formed with the first side wall 10 is 90°. The angle θ32 formed with the second principal plane 3 is more than 90° (preferably about 110° to 130°).

In FIG. 2(f), the second side wall 7 is a curved line, and the angle θ13 formed by the first side wall 10 and the second side wall 7 is approximately 90°. The angle θ33 formed by the second principal plane 3 and the second side wall 7 is approximately 90°.

If angle θ31, θ32 or θ33 formed by the second principal plane 3 and the second side wall 7, is close to 90°, the dosage of Boron, which is implanted into the second side wall 7, in the ion implantation for forming the p-isolation layer 9, drops, and it becomes difficult to obtain a high concentration p-isolation layer 9. Hence angle θ31, θ32 or θ33, formed by the second principal plane 3 and the second side wall 7, is preferably about 110° to 130°.

If this angle θ31, θ32 or θ33 is greater than 140°, then the width of the opening portion of the groove increases close to the thickness of the semiconductor substrate 1, and the area of the p-collector layer 8, which is formed on the second principal plane 3, decreases if the chip size is small, which is not desirable. The shape of the dicing blade used in Example 1 is an inverted trapezoid (FIG. 2(b)).

Figure 3:
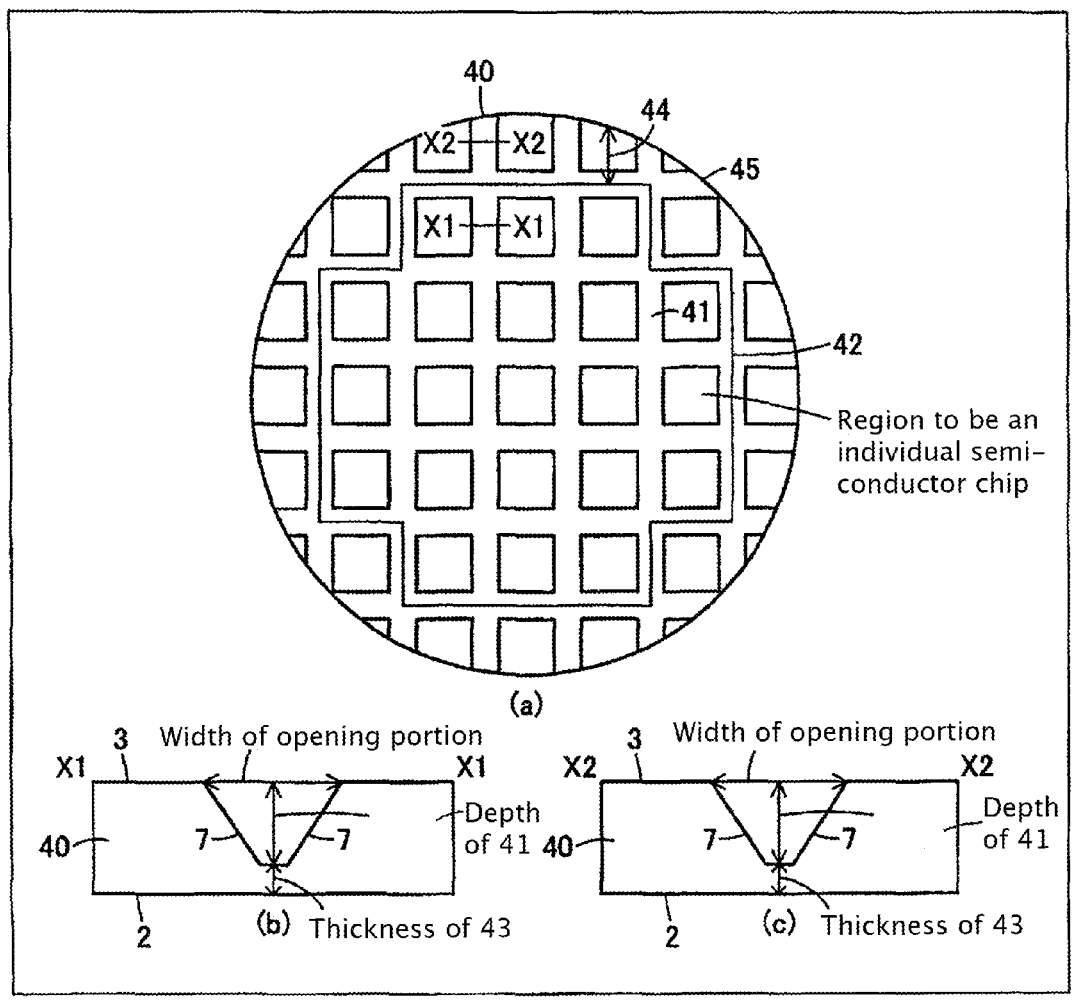
FIG. 3 are diagrams depicting an inverted trapezoid-shaped groove which is formed on the rear face of the wafer, without piercing through the rear face, where

The above content will be described in detail along with the manufacturing method, with reference to FIG. 3. FIG. 3 are diagrams depicting the inverted trapezoid-shaped groove which is formed on the rear face of the wafer without piercing through the rear face, where FIG. 3(a) is a plan view, FIG. 3(b) is a cross-sectional view of a key portion sectioned at the X1-X1 line in FIG. 3(a), and FIG. 3(c) is a cross-sectional view of a key portion sectioned at the X2-X2 line in FIG. 3(a). Here the reference symbols 2 and 3, used for FIG. 1, are also used as the first principal plane (front face) and the second principal plane (rear face) of the wafer 40. The thickness of the residual film 43 shown in FIG. 3 is 50 μm, for example, and the width of the opening portion of the inverted trapezoid-shaped groove 41 is 200 μm, for example.

In Example 1, the depth of the groove 41 formed on the wafer 40 is the same in the chip forming region 42 (region where many chips are formed), and in the outer periphery portion 44 (region where chips are not formed) of the wafer 40, as shown in FIG. 3(b) and FIG. 3(c), and all grooves 41 reach the outer edge 45 of the wafer 40.

Here the wafer 40 refers to a semiconductor substrate in a state before being cut along the dicing region (overlapping the area of the groove 41). Therefore in this example, the semiconductor substrate denoted with the reference number 1 is a substrate after the wafer 40 is cut in the dicing region, and becomes individual semiconductor chips.

The p-diffusion layer 4 shown in FIG. 1 is formed by thermal diffusion in advance, in the 30 μm to 170 μm depth range from the dicing region surface (the first principal plane 2, that is the surface at the opposite side of the side where groove 41 is formed), then the surface IGBT cell structure creation process and the wafer thinning process are performed, and after this, the grooves 41, which do not pierce through the wafer 40, are formed, as shown in FIG. 3(b) and FIG. 3(c), by half cut from the rear face (the second principal plane 3) using a dicing blade (half cut by a dicer or half cut by a cutting blade: half cut means not completely cutting the wafer 40). The depth of the thermal diffusion layer is preferably about 20 μm deeper than the thickness of the residual film 43. This considers the dispersion of the blade cutting depth of the half cut dicing, and the amount of removing the mechanical damage due to dicing by etching.

In other words, a part of the wafer 40 remains as the residual film 43 so that the wafer 40 is maintained to be whole, without being separated by grooves 41. The thickness of this residual film 43 is 10 μm to 150 μm, matching the depth of the p-diffusion layer 4, as mentioned above, and the grooves 41 are formed so that the tips of the groove 41 reach the p-diffusion layer 4.

At this time, as FIG. 3(b) and FIG. 3(c) show, the depth of the groove 41 in the outer periphery portion 44 of the wafer 40 is the same as that [in the chip forming region 42]. A damage layer 47 (see FIG. 7), which is formed on the side wall (second side wall 7) of the formed groove 41 along the half cut, is 1 μm to 20 μm (preferably 1 μm to 15 μm). This damage layer 47 is removed by acid etching or dry etching. The amount to be removed is 2 μm to 50 μm (preferably 3 μm to 30 μm).

The p-isolation layer 9 and the p-collector layer 8 are formed on the second side walls 7 of the grooves 41 after the damage layer 47 is removed, and [formed] on the rear face (second principal plane 3) of the wafer 40, by ion implantation and laser annealing respectively, the collector electrode 18 is formed on the p-collector layer 8, and this collector electrode 18 extends over the p-isolation layer 9. After the collector electrode 18 is formed, the residual film 43, which remained when the grooves 41 are formed, is cut vertically by a dicing blade, and the reverse blocking IGBT chips are completed.

In order to control the impurity amount of ion implantation, the dopant amount of annealing, cracking and chipping of a wafer during dicing or the process after dicing, the shape of the dicing blade is changed to a V shape (reference number 31 in FIG. 2), an inverted trapezoid shape (reference number 32 in FIG. 2) and a U shape (reference number 33 in FIG. 2).

Figure 4:
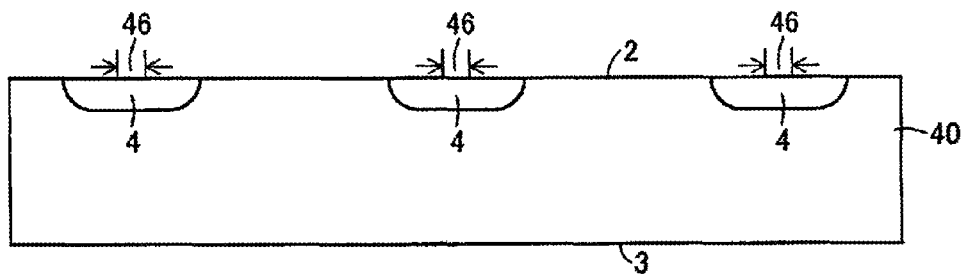
FIG. 4 is a cross-sectional view of a manufacturing process of a key portion of the semiconductor device in FIG. 1.

FIG. 4 to FIG. 11 show a method for manufacturing the semiconductor device in FIG. 1, and are cross-sectional views of manufacturing processes of a key portion shown in the sequence of processes. Here a flow of process to form an area around the p-isolation layer is shown. In FIG. 4, Boron is thermal-diffused from the dicing region 46, which is located on the first principal plane 2 (front face) of the wafer 40, and the high concentration p-diffusion layer 4 is formed to be a 30 μm to 170 μm diffusion depth. This is because the depth (thickness) of the p-diffusion layer 4 is related to the later mentioned thickness of the residual film 43. In other words, if the depth of the p-diffusion layer 4 is less than 30 μm, the thickness of the residual film 43, which is half cut from the opposite surface of the wafer 40, also becomes less than 30 μm. With this thickness, a glass support substrate to secure the wafer 40 is required in order to prevent cracking and chipping of the wafer 40. If [the depth of the p-diffusion layer 4] is less than 10 μm, the laser beam transmits through the residual film 43, and it is possible that the laser beam, which transmitted through the residual film 43, reaches the wafer stage of the laser annealing apparatus, and this stage is damaged by laser irradiation. If the depth of the p-diffusion layer 4 is more than 170 μm, on the other hand, then it takes too much time to form the p-diffusion layer 4, and manufacturing cost increases. Also as mentioned above, the chip size increases because of lateral diffusion, and a number of chips obtained from one wafer decreases, and the diffusion mask becomes thicker, and as a result the manufacturing cost increases.

Figure 5:
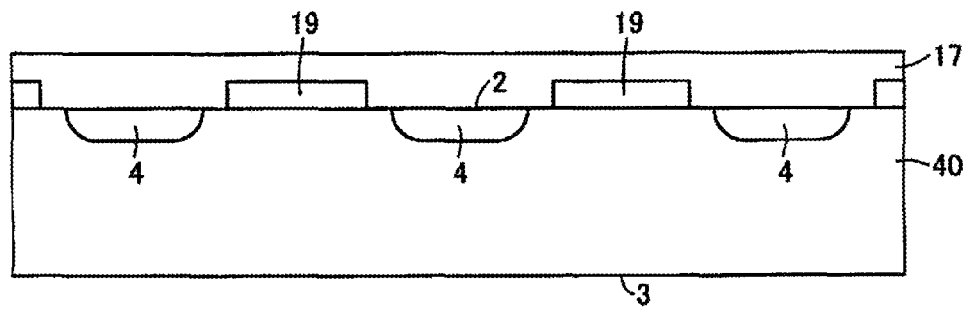
FIG. 5 is a cross-sectional view of a manufacturing process of a key portion of the semiconductor device in FIG. 1, continued FIG. 4.

Then in FIG. 5, the device surface structure 6 (only the MOS gate structure 19 is shown here for convenience) is formed on the first principal plane 2, and the protective film (passivation film 17) is formed on the front face side. Here the MOS gate structure 19 represents the device surface structure 6 in FIG. 1 for convenience. Then in FIG. 6, the wafer 40 is thinned until the second principal plane 3 (rear face) becomes a predetermined thickness.

Figure 7:
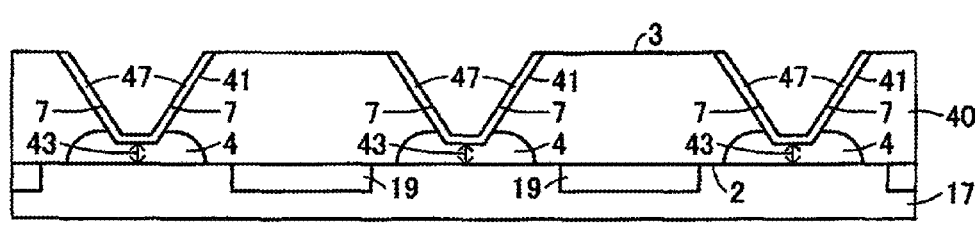
FIG. 7 is a cross-sectional view of a manufacturing process of a key portion of the semiconductor device in FIG. 1, continued FIG. 6.

In FIG. 7, the first principal plane 2 and the second principal plane 3 are inverted and secured, and the groove 41 are formed from the second principal plane 3 (rear face) of the wafer 40 to the first principal plane 2 using an inverted trapezoid-shaped dicing blade. The grooves 41 are formed so as to reach the p-diffusion layer 4 formed on the first principal plane 2. At this time, about 50 μm of residual film 43 remains without cutting the wafer 40 so that the waver 40 is not separated. The thickness of the residual film 43 is smaller than the depth of the p-diffusion layer 4. This is because the bottom portions of the grooves 41 must contact the p-diffusion layer 4 in order to connect the p-isolation layer 9, which is formed on the side walls (second side walls 7) of the grooves 41 created by the dicing blade, to the p-diffusion layer 4.

Hence if the depth of the p-diffusion layer 4 is 30 μm, the thickness of the residual film 43 is set to 30 μm or less. This 30 μm thickness of the residual film 43 is a thickness whereby the glass support substrate is unnecessary. If the thickness of the p-diffusion layer 4 is 170 μm, then the thickness of the residual film 43 is set to 170 μm or less.

About a 1 μm to 20 μm damage layer 47 is generated on the side walls of the grooves 41 (second wide walls 7), so about 2 μm to 50 μm of surface layer is removed by acid etching or dry etching. If the damage layer 47 is shallow, it need not always be removed by etching.

If a dicing blade, with which the depth of the damage layer 47 is less than 1 μm, is used, it takes too much time for cutting. The dicing blade is also more easily damaged. If a dicing blade with which the depth of the damage layer 47 is more than 20 μm is used, cracking and chipping are more easily generated during cutting. As a result, it is preferable to use a dicing blade with which the depth of the damage layer 47 is 1 μm to 15 μm.

Considering the dispersion of the damage layer 47, about 2 μm [of the surface layer] should be removed in order to remove 1 μm of the damage layer 47 by etching. In the case of a 20 μm damage layer 47, 50 μm [of surface layer] should be removed, then the damage layer 47 is removed by etching. In other words, if the dicing blade with which the depth of the damage layer 47 is 1 μm to 15 μm is used, it is preferable to remove 3 μm to 30 μm [of the surface layer] by etching.

Figure 8:
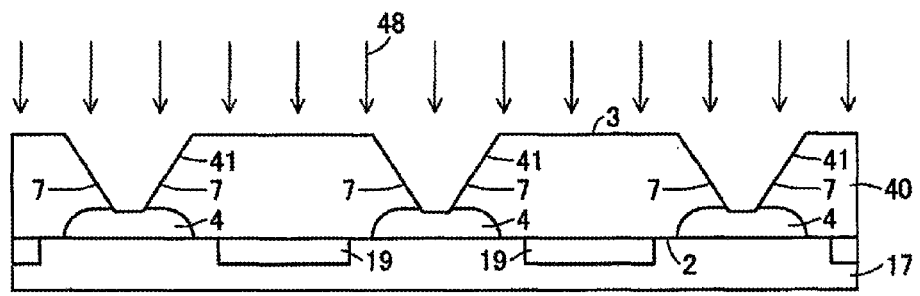
FIG. 8 is a cross-sectional view of a manufacturing process of a key portion of the semiconductor device in FIG. 1, continued FIG. 7.

Then in FIG. 8, a high dosage of dopants, such as Boron 48, are implanted into the side walls (second side walls 7) of the grooves 41 formed from the second principal plane 3 by ion implantation.

Figure 9:
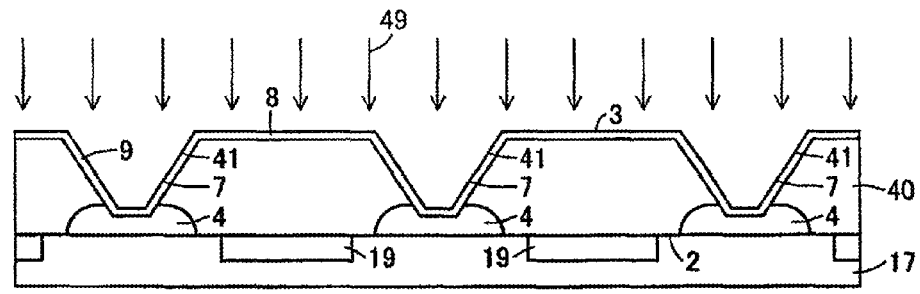
FIG. 9 is a cross-sectional view of a manufacturing process of a key portion of the semiconductor device in FIG. 1, continued FIG. 8.

Then in FIG. 9, the dopants (Boron 48) are activated by furnace annealing up to 550° C. (annealing using a furnace which is heated to a temperature enabling batch processing) or laser annealing using a laser beam 49, so that thermal damage is not caused on the device surface structure 6, whereby a p-isolation layer 9 and p-collector layer 8 are simultaneously formed.

Figure 10:
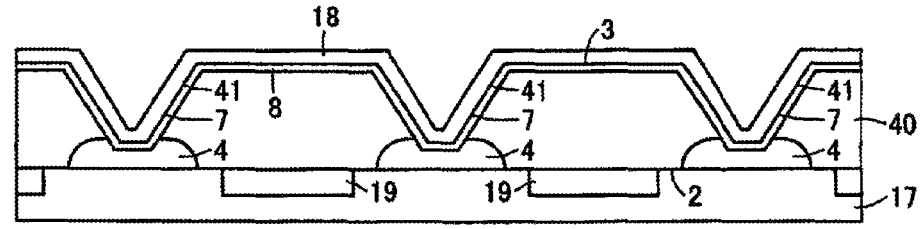
FIG. 10 is a cross-sectional view of a manufacturing process of a key portion of the semiconductor device in FIG. 1, continued FIG. 9.

Then in FIG. 10, the p-isolation layer 4 is formed, and a metal film is deposited, for forming the collector electrode 18 on the entire surface of the second principal plane 3 of the wafer 40 including the p-isolation layer 4. The metal film need not always be deposited on the side faces (second side walls 7) of the groove 41.

Figure 11:
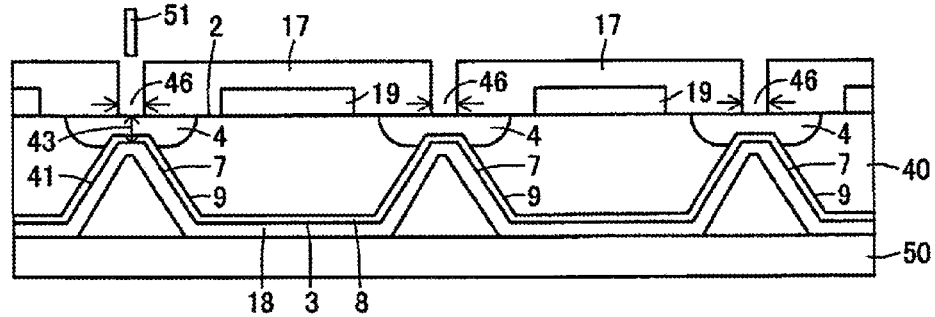
FIG. 11 is a cross-sectional view of a manufacturing process of a key portion of the semiconductor device in FIG. 1, continued FIG. 10.

Finally in FIG. 11, the passivation film 17 on the dicing region 46 is removed, the second principal plane 3 is bonded to the dicing tape 50, the 50 μm thick residual film 43 and the collector electrode 18 are vertically diced from the first principal plane 2 (front face side) along the dicing region 46, so that the wafer 40 is separated into chips, and the process of manufacturing the reverse block IGBT chips is completed. Instead of a dicing cut using a dicing blade, a laser may be used. Thereby the cutting plane of the p-diffusion layer 4 becomes the first side wall 10.

In Example 1, the grooves 41 are formed from the rear face (second principal plane 3) of the wafer 40, without piercing through the front face (first principal plane 2) of the wafer 40, and the residual film 43 remains so that the wafer 40 is not separated, therefore the form of the wafer 40 is maintained without each chip in the chip forming region 42 separating and dropping. As a result, the glass support substrate and the adhesive, which are conventionally required are not needed. The problem of the adhesive being exposed by laser annealing, as described in prior art, does not occur, and the sputtering processing temperature and sintering temperature after sputtering are not restricted by the heat resistance temperature of the adhesive.

Since the glass support substrate and adhesive thereof are not used, activation processing for Boron 48, implanted into the p-isolation layer 9 and the p-collector layer 8, can be simultaneously performed by laser annealing. Also the dopants (Boron 48) in the p-isolation layer 9 and the p-collector layer 8 can be simultaneously activated by furnace annealing at high temperature, to a degree at which the collector electrode 18, that is the Al electrode, is not damaged (up to 550° C.)

Chips can be separated by dicing after the collector electrode 18 is formed. At this time, the chip must be larger for the amount of the dicing blade and the margin thereof. However compared with the case of forming the p-isolation layer with deep thermal diffusion, as shown in the first prior art, the area of the p-isolation layer 9 occupied in a chip according to this example is much smaller, so the size of the chip can be dramatically reduced.

EXAMPLE 2

Figure 12:
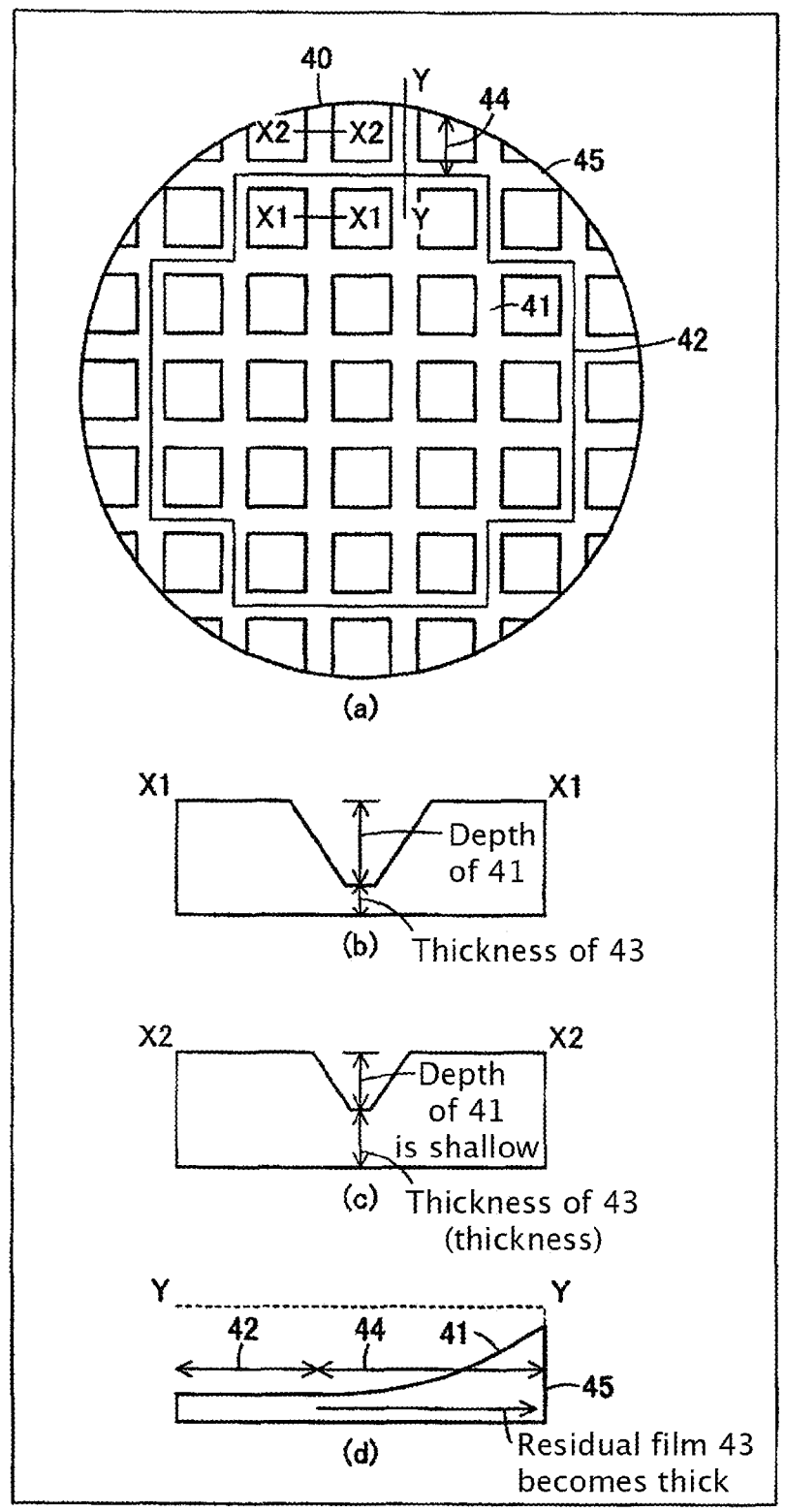
FIG. 12 are manufacturing process drawings depicting a method for manufacturing a semiconductor device of Example 2 of the present invention, where

FIG. 12 is manufacturing process drawings depicting a method for manufacturing a semiconductor device of Example 2 of the present invention, where FIG. 12(a) is a plan view of the wafer, FIG. 12(b) is a cross-sectional view of a key portion sectioned at the X1-X1 line in FIG. 12(a), FIG. 12(c) is a cross-sectional view of a key portion sectioned at the X2-X2 line in FIG. 12(a), and FIG. 12(d) is a cross-sectional view of a key portion sectioned at the Y-Y line in FIG. 12(a). The dotted line in FIG. 12(d) indicates the thickness of the wafer 40 in a portion where the grooves 41 are not formed. FIG. 12 shows the processes of forming the grooves 41, in the case of the depth of the groove 41 is decreased in the outer periphery portion 44 of the wafer 40. The grooves 41 are formed all the way to the outer edge 45 of the wafer 40.

By forming the groove 41 to be shallower in the outer periphery portion 44 of the wafer 40, the film thickness of the residual film 43 becomes thicker closer to the outer edge 45. Then the mechanical strength of the wafer 40 in the outer periphery portion 44 increases, and cracking of the wafer 40 along the grooves 41 can be prevented. Further, an increase of mechanical strength makes handling of the wafer 40 easier.

EXAMPLE 3

Figure 13:
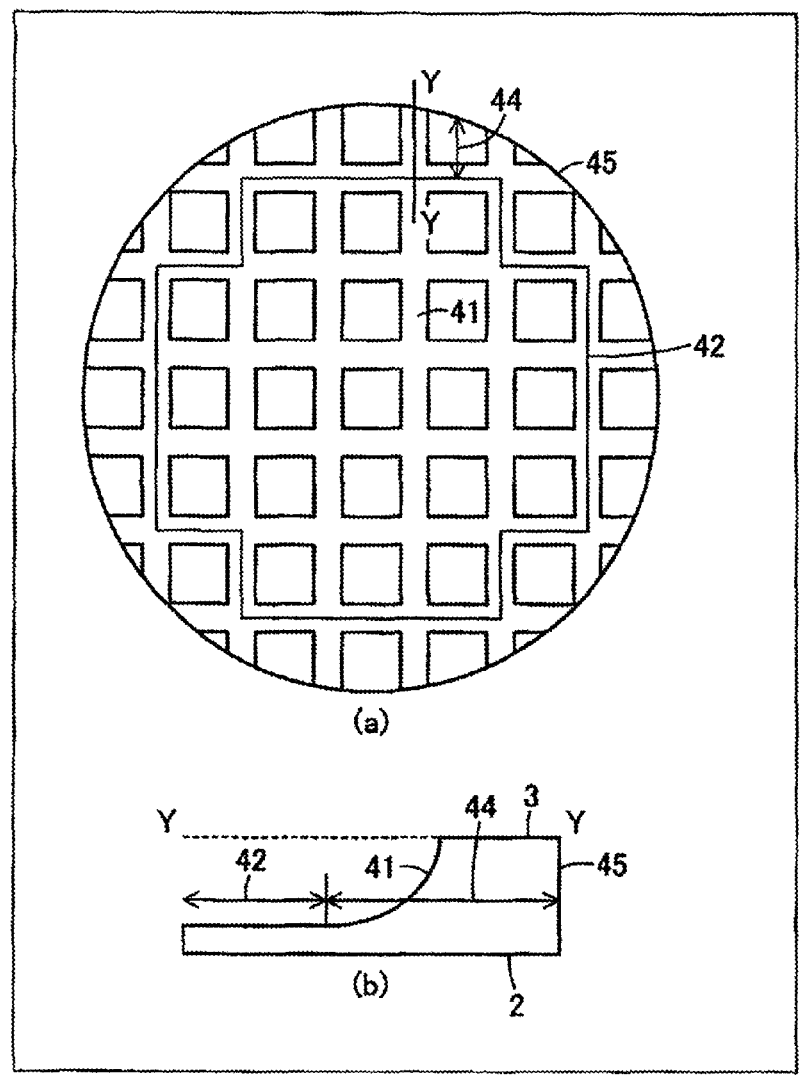
FIG. 13 are manufacturing process drawings depicting a method for manufacturing a semiconductor device of Example 3 of the present invention, where

FIG. 13 is manufacturing process drawings depicting a method for manufacturing a semiconductor device of Example 3 of the present invention, where FIG. 13(a) is a plan view of a process of a key portion of the wafer, and FIG. 13(b) is a cross-sectional view of a process of a key portion sectioned at the Y-Y line in FIG. 13(a). The dotted line in FIG. 13(b) indicates the thickness of the wafer 40 in a portion where the groove 41 is not formed. FIG. 13 shows the processes of forming the grooves 41, in the case where the depth of the groove 41 is decreased in an area away from the chip forming region 42, so that a part of the groove 41 does not reach the outer edge 45 of the wafer 40.

This makes the thickness of the residual film 43 in the outer periphery portion 44 thicker than the case of FIG. 12, so the wafer 40 is even less likely to be cracked than the case of FIG.

12. Further, an increase of the mechanical strength makes handling of the wager 40 even easier.

EXAMPLE 4

Now a method for manufacturing a semiconductor device according to Example 4 will be described. FIG. 14 to FIG. 20 show the method for manufacturing the semiconductor device according to Example 4, and are cross-sectional views of the manufacturing processes of a key portion, shown in the sequence of the processes. In the method for manufacturing the semiconductor device according to Example 4, the p-isolation layer 9 and the p-collector layer 8 are formed by laser annealing using laser beams having different irradiation energy densities respectively. Here a case of fabricating a reverse blocking IGBT, of which withstand voltage is 1200 V and thickness of the chip is 200 μm using an FZ wafer, of which thickness is 500 μm, for example, will be described.

Figure 6:
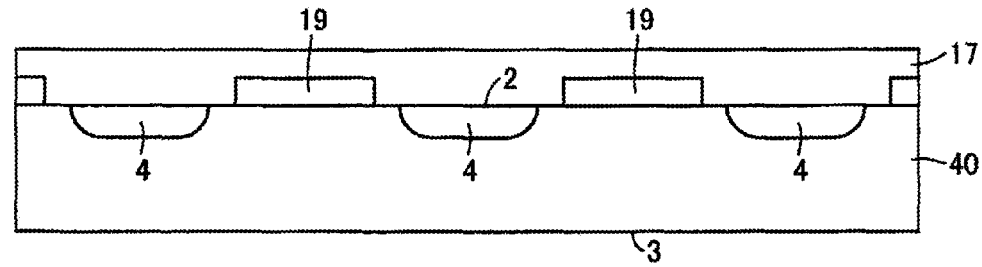
FIG. 6 is a cross-sectional view of a manufacturing process of a key portion of the semiconductor device in FIG. 1, continued FIG. 5.

First as FIG. 4 shows, thermal diffusion is performed in a high temperature furnace, at 1300° C., for example, for about 75 hours, and the p-diffusion layer 4, of which bonding depth is about 100 μm, for example, is formed. Then as FIG. 5 shows, the IGBT structure (MOS gate structure 19) on the front face is formed, and the surface protective film (passivation film 17) is formed. Here the gate structure can be either a planner gate structure or a trench gate structure. Then as FIG. 6 shows, the wafer 40 is thinned until the second principal plane 3 (rear face) becomes a predetermined thickness (e.g. 200 μm), and then the first principal plane 2 and the second principal plane 3 are inverted and secured.

Figure 14:
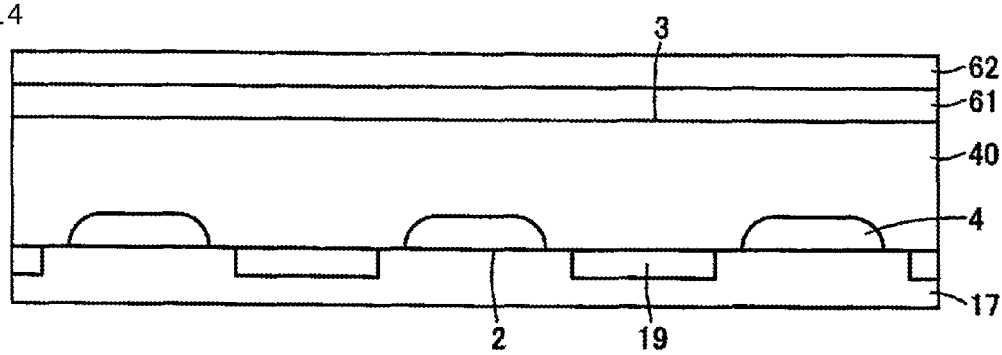
FIG. 14 is a cross-sectional view of a manufacturing process of a key portion of the semiconductor device according to Example 4.

Then as FIG. 14 shows, an aluminum (Al) film 61 and a negative resist film 62 are formed on the surface of the second primary plane 3 in this sequence. By this, the Al film 61 is formed between the second principal plane 3 of the wafer and the negative resist film 62. Since the Al film 61 adheres well to silicon, that is the second principal plane 3 and the negative resist film 62, separation of the negative resist film 62 is prevented.

The Al film 61 may be an Al—Si film, that is aluminum in which silicon is doped, but may also be a pure Al film, since this film is removed in the end, and high temperature heat processing, which could generate spikes, is not performed from the film deposition to the film removal. If a pure Al film is formed as the Al film 61, the film may be formed by a sputtering method or by a deposition method.

It is preferable that the film thickness of the Al film 61 is thicker than 0.05 μm, and thinner than 1 μm. This is because if the Al film 61 is 0.05 μm or less, the function as a reflection film to reflect a laser beam drops dramatically in the subsequent laser annealing process. If the film thickness of the Al film is 0.05 μm or less, the sputtering time becomes extremely short, which makes it difficult to control the film thickness. In concrete terms, the plasma discharge is unstable immediately after the start of sputtering, so the uniformity of film thickness drops if the sputtering time is short. If the film thickness of the Al film 61 is 1 μm or more, implanting Boron through the Al film 61 to the wafer, in a portion covered by the Al film 61 in a subsequent ion implantation process, is difficult. If the film thickness of the Al film 61 is 1 μm or more, the Al film 61 becomes turbid (hazed), and the reflectance of the Al film 61 to a laser beam drops.

Figure 15:
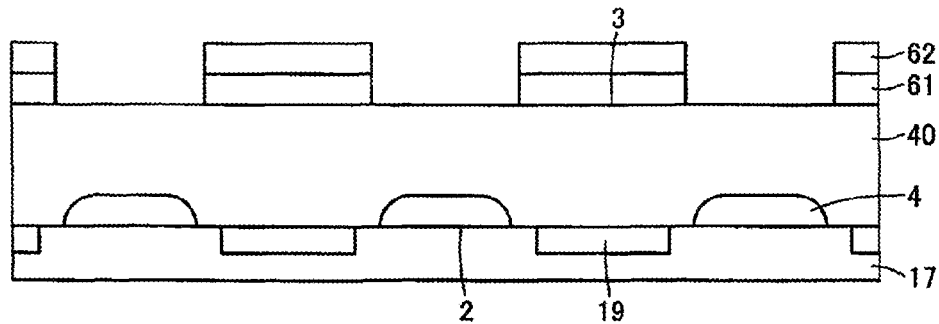
FIG. 15 is a cross-sectional view of a manufacturing process of a key portion of the semiconductor device according to Example 4, continued from FIG. 14.

As FIG. 15 shows, opening portions are formed on the Al film 61 and the negative resist film 62 on the surface of the second principal plane 3 using a double sided mask aligner, for example, so as to correspond to the patterns formed on the first primary plane 2, and an etching mask is formed. Here it is easier to form these opening portions in the Al film 61 and the negative resist film 62 by wet etching using a mixed solution of phosphoric acid, nitric acid and acetic acid, rather than dry etching, since the negative resist film 62 has a strong chemical resistance.

Figure 16:
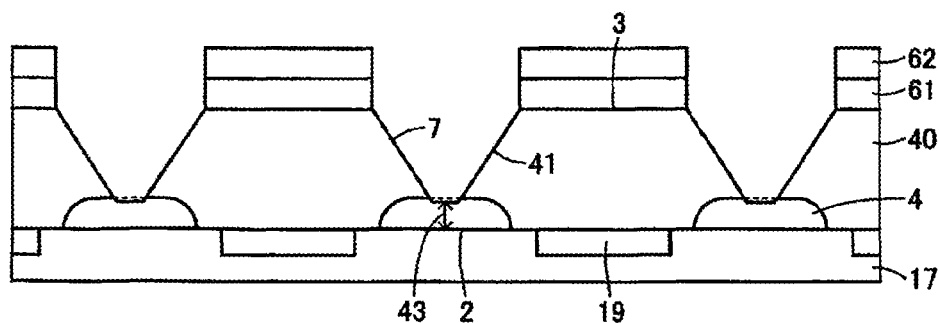
FIG. 16 is a cross-sectional view of a manufacturing process of a key portion of the semiconductor device according to Example 4, continued from FIG. 15.

Then as FIG. 16 shows, the grooves 41 are formed in the dicing region of the second principal plane 3 by RIE dry etching using HBr, NF3 or He/$O_2$, for example, as the etching gas using the etching mask, formed in FIG. 15, as a mask. Thus the negative resist film 62 functions as a mask for etching the grooves 41. At this time, the side wall (second side wall 7) of the groove 41 may be tapered by relatively increasing the flow rate of He/$O_2$, which is used for RIE etching. In concrete terms, the tilt angle of the second side wall 7, with respect to the second principal plane 3, is formed to be 75°, for example.

Figure 30:
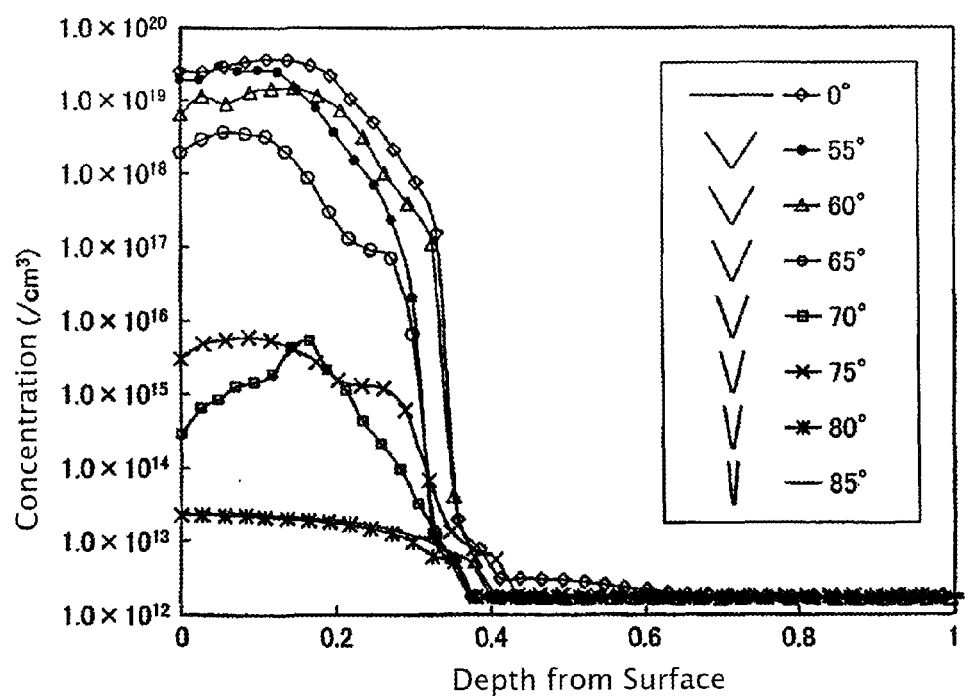
FIG. 30 is a graph depicting carrier profiles based on the tilt angle of the side wall of the groove.
Figure 31:
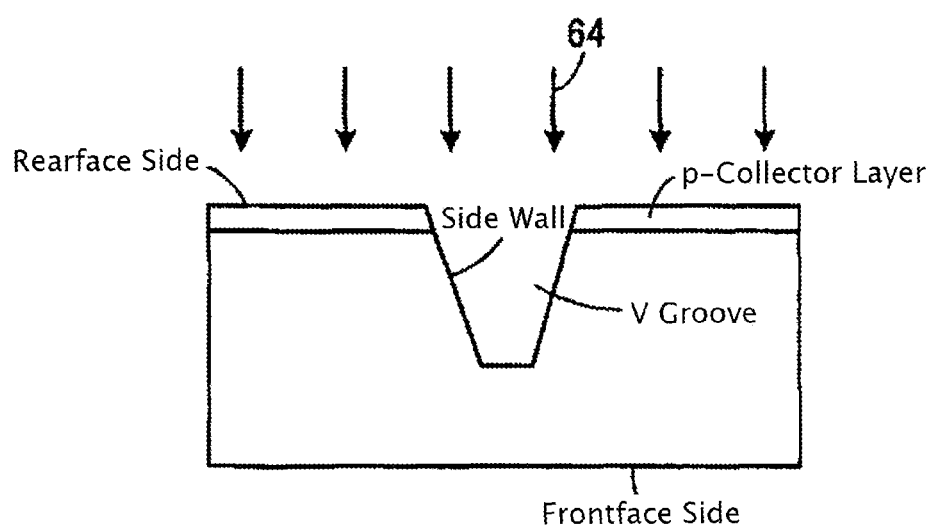
FIG. 31 is a diagram depicting a problem of performing laser annealing on a tapered groove.
Figure 32:
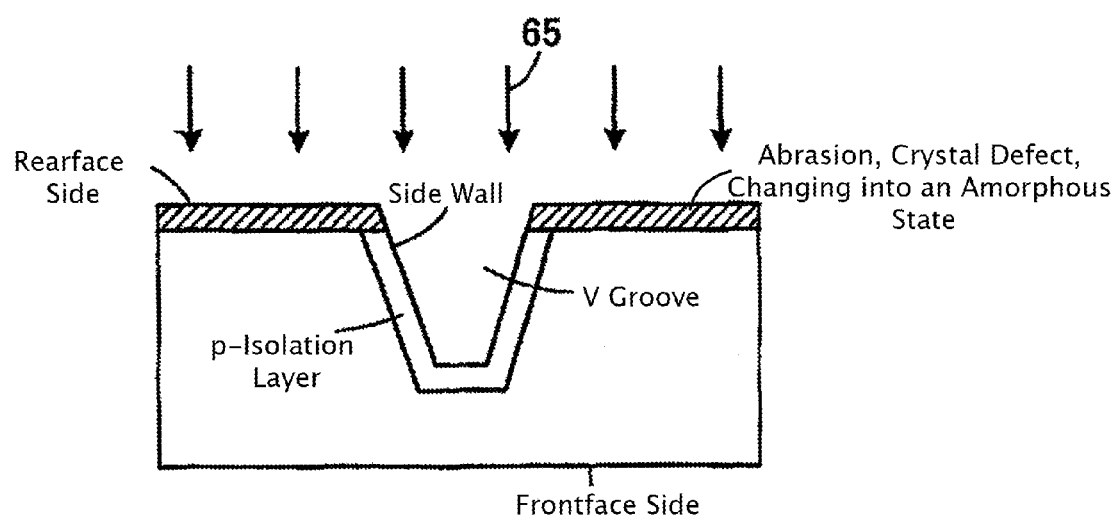
FIG. 32 is a diagram depicting a problem of performing laser annealing on a tapered groove.

Here it is preferable that the tilt angle of the second side wall 7, with respect to the second principal plane 3, is at least 40°, lower than 85° C. This is because if the tilt angle is below 40°, for example, the width of the groove 41 becomes too wide to form a groove 41 having a desired depth, and the collector electrode area becomes small. On the other hand, if the tilt angle is 85° or more, for example, the second side wall 7 of the groove 41 can hardly absorb the laser beam during the later mentioned laser annealing, even if the irradiation energy density of the laser beam is increased, which makes it difficult to activate the dopants (see FIG. 30).

The depth of the groove 41 is formed to reach the p-diffusion layer 4. In concrete terms, [the depth of the groove 41] is about 110 μm to 120 μm if the thickness of the wafer 40 is about 200 μm, and the diffusion depth of the p-diffusion layer 4 is about 100 μm. In other words, it is preferable that the grooves 41 are formed such that the p-diffusion layer 4 is etched for about 10 μm to 20 μm.

By this, the thickness of the residual film 43, where the distance from the bottom face of the groove 41 to the first principal plane 2 is the thinnest, is about 80 μm to 90 μm, and the mechanical strength can be sufficiently maintained without reinforcing with the support substrate. This step of forming the grooves 41 is close to the final stage of the process to generate the reverse blocking IGBT, after the MOS gate structure 19 is formed, so inside the grooves 41 need not be filled.

Figure 17:
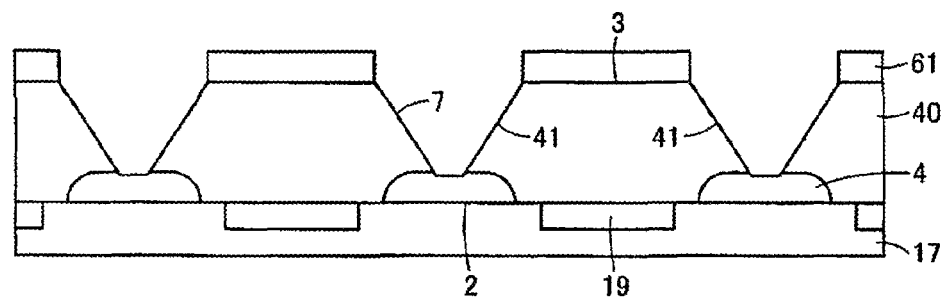
FIG. 17 is a cross-sectional view of a manufacturing process of a key portion of the semiconductor device according to Example 4, continued from FIG. 16.

Then as FIG. 17 shows, the negative resist film 62 is stripped by dipping the wafer 40 in resist stripper, such as resist stripper OMR-502A (made by Tokyo Ohka Kogyo Co., Ltd.).

Figure 18:
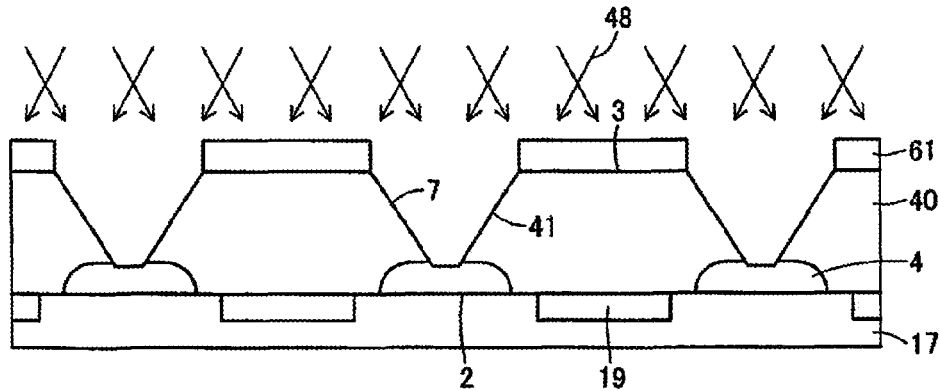
FIG. 18 is a cross-sectional view of a manufacturing process of a key portion of the semiconductor device according to Example 4, continued from FIG. 17.

Then as FIG. 18 shows, a high dosage of such dopants as Boron 48 are implanted into the second principal plane 3 and the second side walls 7 of the grooves 41 by ion implantation. At this time, ion implantation is performed with an implantation energy, with which Boron 48 can be implanted into the second principal plane 3 covered with the Al film 61, through the Al film 61. As mentioned above, if the film thickness of the Al film 61 is thinner than 1 μm, Boron 48 can be implanted into the second principal plane 3, covered with the Al film 61, through the Al film 61, using a regular ion implanter.

The implanting angle during the ion implantation may be vertical to the second principal plane 3, or may be tilted so that the dosage of ions to be implanted into the second side wall 7 can be increased, and ions may be implanted in stages, such as in four installments. The mechanism for implementing at a tilt angle like this is included as a standard in a regular ion implanter.

Figure 19:
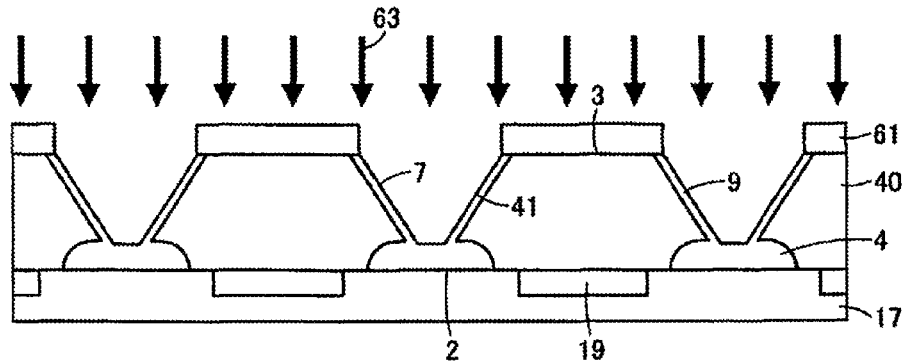
FIG. 19 is a cross-sectional view of a manufacturing process of a key portion of the semiconductor device according to Example 4, continued from FIG. 18.

Then as FIG. 19 shows, the dopants implanted in the second side wall 7 are activated by irradiating the first laser beam 63, having high irradiation energy density, onto the second principal plane 3, and the p-isolation layer 9 is formed. Here "high irradiation energy density" refers to an irradiation energy density that is sufficient to activate the dopants implanted in the second side wall 7. In concrete terms, if the tilt angle of the second side wall 7 is 75°, for example, the first laser beam 63, of which irradiation energy density is 5.4 J/cm$^2$, for example, is irradiated. This surface of the second principal plane 3 is covered with the Al film 61, and the laser beam 63 is reflected by the Al film 61 at this time, so the dopants implanted in the second principal plane 3 are not activated. Then the Al film 61 is removed by wet etching using a mixed solution of phosphoric acid, nitric acid and acetic acid, for example.

Figure 20:
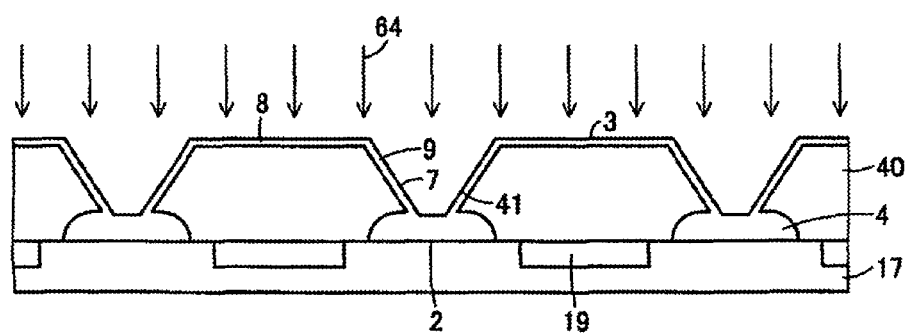
FIG. 20 is a cross-sectional view of a manufacturing process of a key portion of the semiconductor device according to Example 4, continued from FIG. 19.

Then as FIG. 20 shows, the second laser beam 64 having low irradiation energy density is irradiated onto the second principal plane 3 exposed by removal of the Al film 61, so that the dopants implanted in the second principal plane 3 are activated, and the p-collector layer 8 is formed. Here "low irradiation energy density" refers to irradiation energy density that is sufficient to activate the dopants implanted in the second principal plane 3. In concrete terms, the second laser beam 64, of which irradiation energy density is 1.4 J/cm$^2$, is irradiated. In this case, if the tilt angle of the second side wall 7 is 75°, for example, the effective irradiation energy density to be irradiated onto the second side wall 7 is about 0.36 J/cm$^2$, so [the second primary plane 3] is not affected.

In this way, the p-isolation layer 9 and the p-collector layer 8 are formed by laser annealing processing using laser beams having different irradiation energy densities respectively. The rest of processing is the same as Example 1 to Example 3, so description thereof is omitted.

As mentioned above, according to Example 4, the same effects as Example 1 to Example 3 can be implemented. Even if the grooves, of which the tilt angle is 60° or more, are formed, the plane on which the opening portions of the grooves are formed is not affected, and dopants implanted in the side walls of the grooves can be activated.

EXAMPLE 5

Now a method for manufacturing a semiconductor device according to Example 5 will be described. FIG. 21 to FIG. 24 show the method for manufacturing the semiconductor device according to Example 5, and are cross-sectional views of the manufacturing processes of a key portion, shown in the sequence of the processes. In the method for manufacturing the semiconductor device according to Example 5, the grooves 41 are formed by half cut dicing using a dicing blade 72, and the p-isolation layer 9 and the p-collector layer 8 are formed by laser annealing using [the laser beams] having different irradiation energy densities respectively. Here a case of fabricating a reverse blocking IGBT, of which withstand voltage is 1200 V and thickness of the chip is 200 μm using an FZ wafer of which thickness is 500 μm, for example, will be described.

First just like Example 4, the p-diffusion layer 4, MOS gate structure 19 and passivation film 17 are formed on the first principal plane 2 side, and the wafer 40 is thinned until the second principal plane 3 (rear face) becomes a predetermined thickness (e.g. 200 μm), and then the first principal plane 2 and the second principal plane 3 are inverted and secured.

Figure 21:
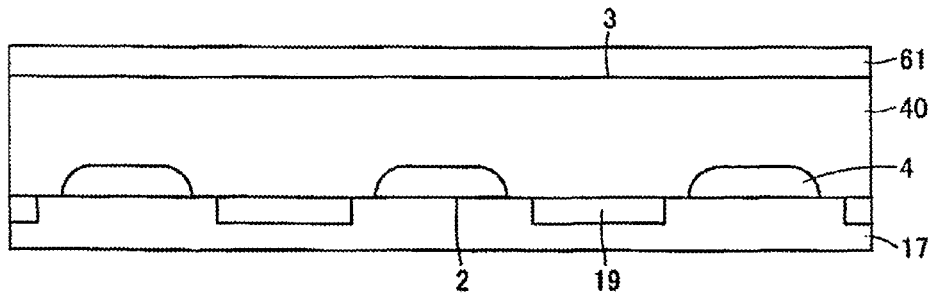
FIG. 21 is a cross-sectional view of a manufacturing process of a key portion of a semiconductor device according to Example 5.
Figure 22:
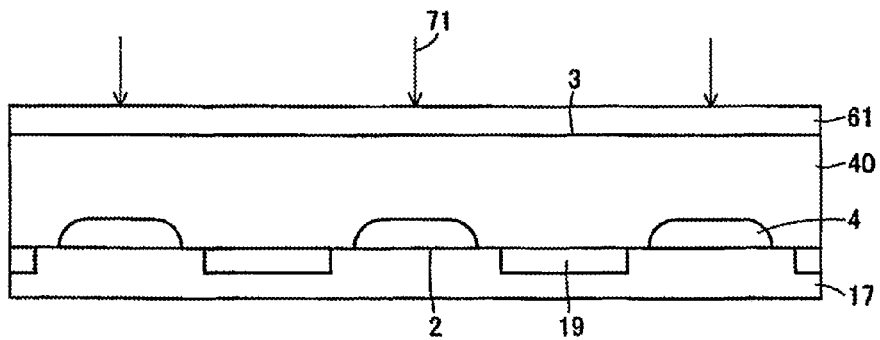
FIG. 22 is a cross-sectional view of a manufacturing process of a key portion of the semiconductor device according to Example 5, continued from FIG. 21.

Then as FIG. 21 shows, only the aluminum (Al) film 61 is formed on the surface of the second principal plane 3. Then as FIG. 22 shows, alignment marks 71 are formed in the dicing area of the Al film 61, formed on the surface of the second principal plane 3, so as to correspond to the patterns formed on the first principal plane 2. In FIG. 22, marking processing is performed using a rear face marking apparatus, for example.

Figure 25:
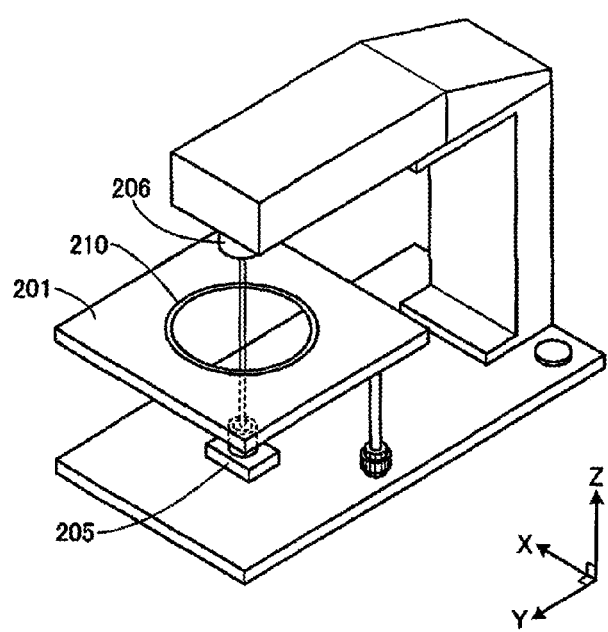
FIG. 25 is a diagram depicting a structure of a rear face making apparatus.
Figure 26:
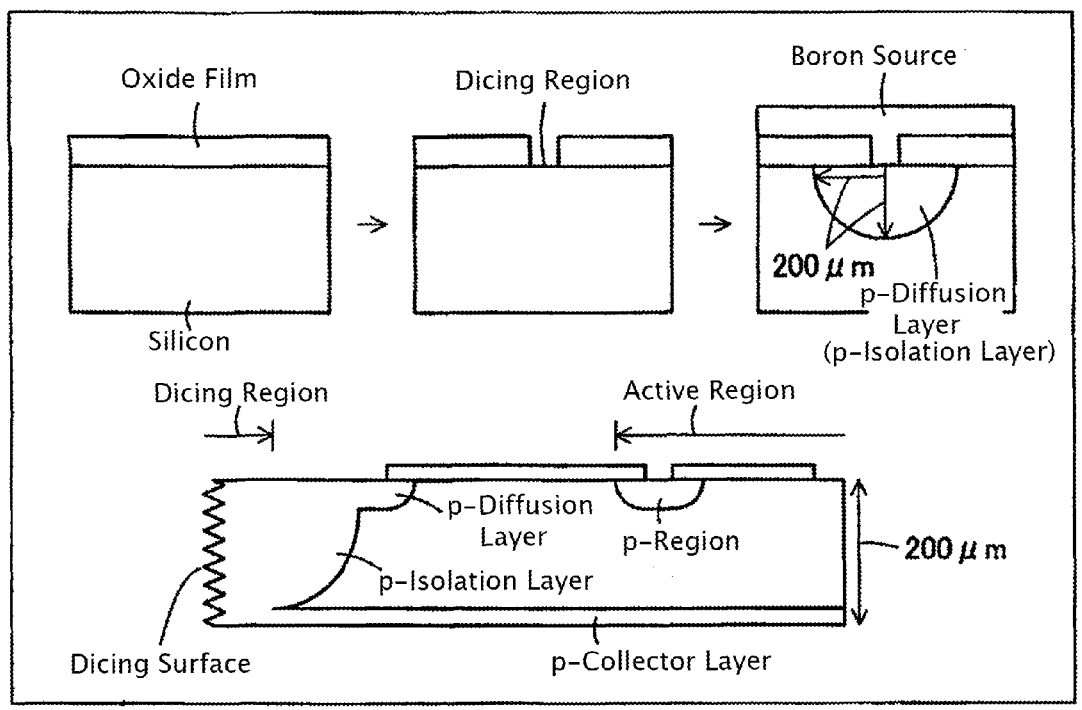
FIG. 26 are process drawings of forming a isolation layer of a reverse blocking IGBT manufactured according to a first prior art, and the cross-sectional view of the device.
Figure 27:
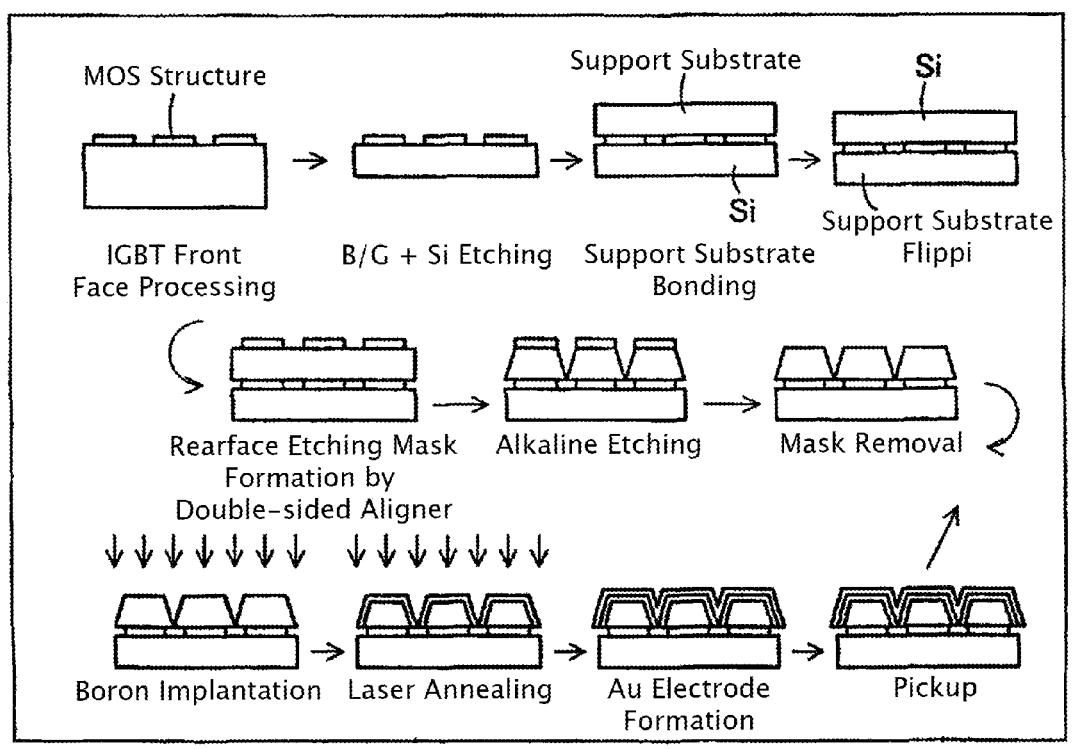
FIG. 27 are process drawings of a reverse blocking IGBT manufactured according to a second prior art.
Figure 28:
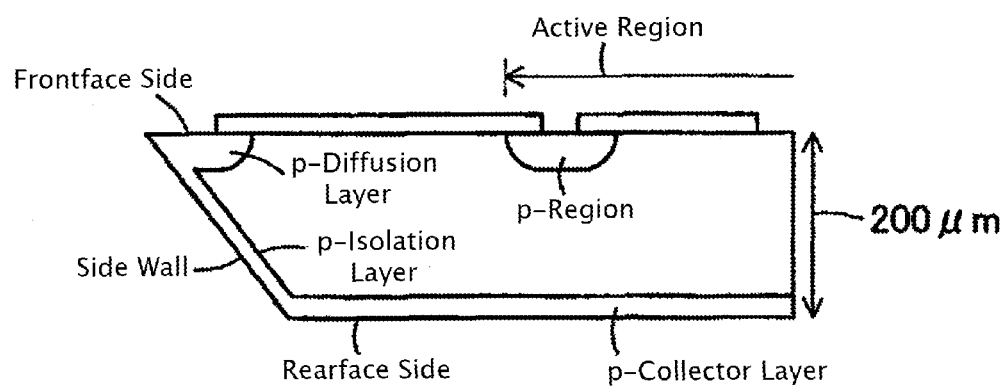
FIG. 28 is a cross-sectional view of the reverse blocking IGBT manufactured in the process in FIG. 27.
Figure 29:
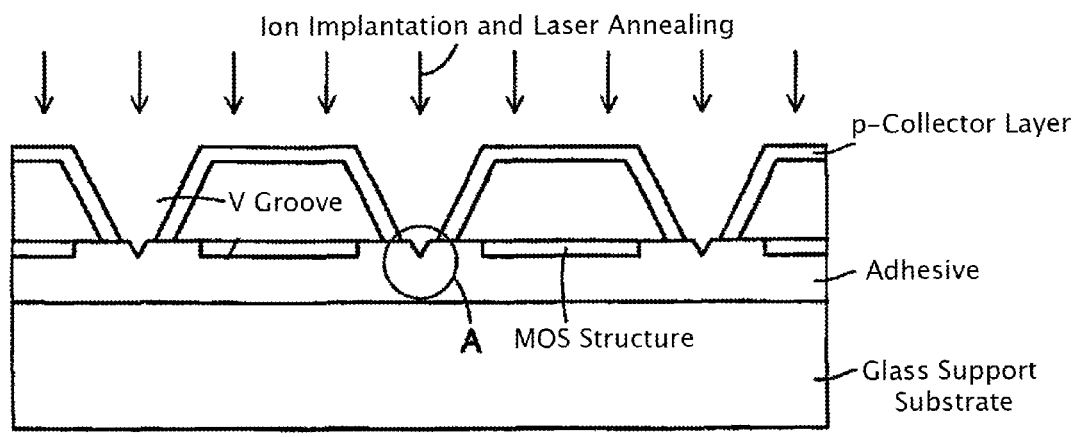
FIG. 29 is a cross-sectional view of the process in FIG. 27 where ion implantation and laser annealing are performed.

FIG. 25 is a diagram depicting a structure of a rear face marking apparatus. As FIG. 25 shows, the rear face marking apparatus 200 has a stage 201, CCD camera 205 and laser marking unit 206. An opening portion 210 is formed on the stage 201.

Now a marking processing method by the rear face marking apparatus 200 will be described. First ground glass, for example, is placed on the opening portion 210 of the stage 201, and a laser beam, of which power is weakened by the laser marking unit 206, is irradiated onto the ground glass. The luminescent spot of the laser beam irradiated onto the ground glass is the center of the processing of the laser marking unit 206. And the luminescent spot of the laser beam irradiated onto the ground glass is adjusted to come to the center of the output monitor of the CCD camera 205, that is, the viewing center of the CCD camera 205. In this way, the viewing center of the CCD camera 205 and the processing center of the laser marking unit 206 are aligned.

Then the wafer 40 is placed on the opening portion 210 of the stage 201 with the first principal plane 2 side down, that is, facing the CCD camera 205. The pattern formed on the first principal plane 2 is viewed by the CCD camera 205, the laser beam is irradiated onto the second principal plane 3 by the laser marking unit 206, and the alignment mark 71 is formed approximately at the center of the dicing region of the second principal plane 3.

In the marking processing, alignment marks 71 may be formed using ink marks by inkjet, rather than by laser beam.

Figure 23:
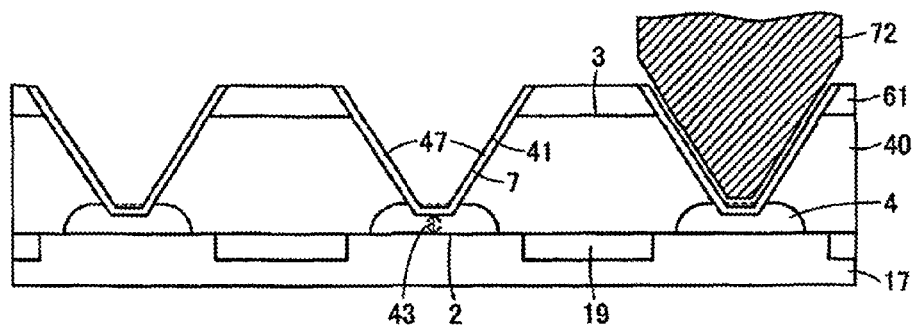
FIG. 23 is a cross-sectional view of a manufacturing process of a key portion of the semiconductor device according to Example 5, continued from FIG. 22.

Then as FIG. 23 shows, after [the wafer 40] is aligned using the alignment marks 71 formed in FIG. 22, half cut is performed using a dicing blade 72, of which edge is tapered, so that the wafer 40 is not separated. In FIG. 23, the dicing blade 72 having an inverted trapezoid-shaped cross-section is shown, but a dicing blade of which cross-section has a V-shape (see FIG. 2(*a*)), for example, may be used only if the second side wall 7 of the groove 41 to be formed is tapered. In this way, the shape of the edge of the dicing blade 72 is adjusted according to the desired shape of the groove 41 and the tilt angle of the side wall of the groove 41.

Here cutting using a dicing blade 72 generates cutting dust during dicing. In Example 5, the second principal plane 3 is covered with the Al film 61, and this Al film 61 plays the function of the protective film, so the second principal plane 3 is not exposed to the attack of the cutting dust colliding, and contamination due to the adhesion of cutting dust is not generated. Because of cutting by a dicing blade, a damage layer 47 is generated on the cutting surface due to mechanical damage.

Figure 24:
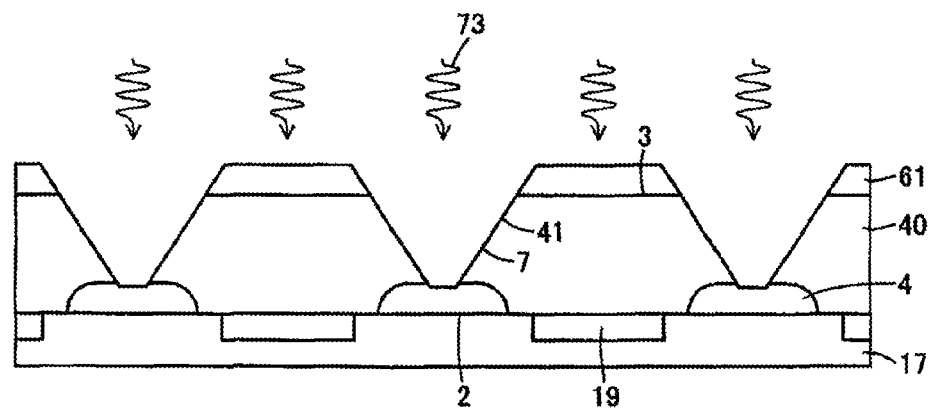
FIG. 24 is a cross-sectional view of a manufacturing process of a key portion of the semiconductor device according to Example 5, continued from FIG. 23.

Then as FIG. 24 shows, the damage layer is removed by etching using etching gas (or an etching solution) 73. In FIG. 24, the etching may be dry etching with which mask selection ratio is relatively high for such a metal as Al, or may be wet etching using an etching solution with which Al is not dissolved.

In the case of using wet etching, silicon can be etched without dissolving the Al very much if a solution created by dissolving silicon in TMAH (Tetra Methyl Ammonium Hydroxide) and mixing an oxidizing agent (e.g. ammonium peroxydisulfate) is used, as stated in Guizhen Yan and five others: "An improved TMAH Si-etching solution without attacking exposed aluminum", Sensors and Actuators A, 2001, Vol. A89, No. 1/2, pp. 135-141. Hydro fluoro-nitric acid may be used as the solution, since the etching rate of Al is sufficiently smaller than that of silicon, although this depends on the thickness of the Al film. The rest of the processing is the same as Example 4, so description thereof is omitted.

According to Example 5, the same effects as Example 1 to Example 4 can be implemented. Furthermore, even if a reverse blocking IGBT having a different withstand voltage, such as 1200 V or 1700 V, is fabricated, the reverse blocking IGBT having a high withstand voltage can be fabricated in a short time, since the time required for forming the grooves by cutting, using a dicing blade, is almost the same when the isolation diffusion layer of which depth is about 200 μm or 300 μm, for example, is formed. Also regardless the depth of the isolation diffusion layer, the depth of the isolation layer formed by thermal diffusion can be the same, so even a reverse blocking IGBT having a different withstand voltage can be fabricated by the same diffusion processing, that is, in a same batch under the same conditions.

INDUSTRIAL APPLICABILITY

As described above, the semiconductor device according to the present invention and a manufacturing method thereof are useful for power semiconductor devices used for power conversion apparatuses, and are particularly appropriate for reverse blocking devices.

The invention claimed is:

1. A method for manufacturing a semiconductor device, comprising the steps of:
    forming a second conductive type first region on a surface layer of a first principal plane of a wafer and in an outer periphery portion of a semiconductor device formed on the wafer;
    forming grooves which reach the first region with a dicing blade from a second principal plane to the first principal plane of the wafer;
    removing processing strain formed on the grooves by etching;
    forming a second conductive type isolation layer on a surface layer of the grooves and a second conductive type collector layer on a surface layer of the second principal plane so that the isolation layer and the collector layer are connected;
    forming a collector electrode on the collector layer; and
    cutting into chips the wafer in the first region sandwiched between the first principal plane and each bottom portion of the grooves approximately vertically with respect to the first principal plane by dicing or by laser.

2. The method for manufacturing a semiconductor device according to claim 1, characterized in that a depth of the first region is 30 μm or more and 170 μm or less.

3. The method for manufacturing a semiconductor device according to claim 1 or claim 2, characterized in that a distance between the bottom portions of the grooves and the first principal plane is 10 μm or more and 150 μm or less.

4. The method for manufacturing a semiconductor device according to claim 1, characterized in that a shape of the dicing blade for forming the grooves is a V shape, inverted trapezoid shape or U shape.

5. The method for manufacturing a semiconductor device according to claim 1, characterized in that the collector electrode is extended toward an inner wall of the grooves.

6. The method for manufacturing a semiconductor device according to claim 1, characterized in that a depth of the processing strain of the grooves is 1 μm or more and 20 μm or less.

7. The method for manufacturing a semiconductor device according to claim 1, characterized in that a depth, when removing the processing strain of the grooves by etching, is 3 μm or more and 50 μm or less.

8. The method for manufacturing a semiconductor device according to claim 1 or claim 7, characterized in that the etching is performed by acid etching or dry etching.

9. The method for manufacturing a semiconductor device according to claim 1, characterized in that a depth of the grooves in an outer periphery portion of the wafer away from a region to be the chips is shallower than a depth of the grooves in the region to be the chips.

10. The method for manufacturing a semiconductor device according to claim 1, characterized in that at least a part of the grooves do not reach an outer edge of the wafer in an outer periphery portion of the wafer away from a region to be the chips.

11. The method for manufacturing a semiconductor device according to claim 1, characterized in that the isolation layer and the collector layer are simultaneously formed by performing ion implantation and thermal processing on side faces of the grooves formed with the dicing blade and the second principal plane.

12. A method for manufacturing a semiconductor device, comprising the steps of:
    forming a second conducive type first region on a surface layer of a first principal plane of a wafer and in an outer periphery portion of a semiconductor device formed on the wafer;
    forming a composite mask by forming an aluminium film and a negative resist film in this sequence on a second principal plane of the wafer and performing patterning;
    performing dry etching using the composite mask as an etching mask and forming grooves reaching the first region so that a groove width widens from a bottom portion to an opening portion;
    selectively removing the negative resist film;
    implanting second conductive type impurity ions into the second principal plane under the aluminum film and side faces of the grooves;
    irradiating a first laser beam onto an entire surface on a side of the second principal plane of the wafer under relatively high energy conditions, which are appropriate for activating the impurity ions implanted into the side faces of the grooves, in a state of the aluminum film remaining in the second principal plane of the wafer, and forming a second conductive type isolation layer on a surface layer of the side faces of the grooves;
    removing the aluminum film and exposing the second principal plane;
    irradiating a second laser beam onto the entire surface on a side of the second principal plane of the wafer under relatively low energy conditions, which are appropriate for activating the impurity ions implanted into the second principal plane, and forming a second conductive type collector layer on a surface layer of the second principal plane so that the isolation layer and the collector layer are connected;
    forming a collector electrode on the collector layer; and
    cutting into chips the wafer in the first region sandwiched between the first principal plane and each bottom portion of the grooves approximately vertically with respect to the first principal plane by dicing or by a laser beam.

13. The method for manufacturing a semiconductor device according to claim 12, characterized in that the aluminum film is formed to have a thickness thicker than 0.05 μm and thinner than 1 μm.

14. A method for manufacturing a semiconductor device, comprising the steps of:

forming a second conductive type first region on a surface layer of a first principal plane of a wafer and in an outer periphery portion of a semiconductor device formed on the wafer;

forming an aluminum film on a second principal plane of the wafer;

forming grooves reaching the first region from the second principal plane to the first principal plane of the wafer with a dicing blade so that a groove width widens from a bottom portion to an opening portion;

implanting second conductive type impurity ions into the second principal plane under the aluminum film and side faces of the grooves;

irradiating a first laser beam onto an entire surface on a side of the second principal plane of the wafer under relatively high energy conditions, which are appropriate for activating the impurity ions implanted into the side faces of the grooves, in a state of the aluminum film remaining in the second principal plane of the wafer, and forming a second conductive type isolation layer on a surface layer of the side faces of the grooves;

removing the aluminum film and exposing the second principal plane;

irradiating a second laser beam onto the entire surface on a side of the second principal plane of the wafer under relatively low energy conditions, which are appropriate for activating the impurity ions implanted into the second principal plane, and forming a second conductive type collector layer on a surface layer of the second principal plane so that the isolation layer and the collector layer are connected;

forming a collector electrode on the collector layer; and cutting into chips the wafer in the first region sandwiched between the first principal plane and each bottom portion of the grooves approximately vertically with respect to the first principal plane by dicing or by a laser beam.

15. The method for manufacturing a semiconductor device according to claim 14, further comprising a step of:

removing processing strain, formed in the grooves due to the dicing blade, by etching in a state of the aluminum film remaining, after the grooves are formed with the dicing blade and before implanting the impurity ions.

16. The method for manufacturing a semiconductor device according to claim 14, characterized in that a cross-sectional shape of the dicing blade for forming the grooves is a V shape, or inverted trapezoid shape.

17. The method for manufacturing a semiconductor device according to any one of claim 12 to claim 16, characterized in that the groove is formed so that an angle, formed by a line extending from the second principal plane where the opening portion is formed and the side face of the groove, is 40° or more and 85° or less on the opening portion of the groove.

* * * * *